United States Patent
Patil et al.

(10) Patent No.: US 11,296,022 B2
(45) Date of Patent: Apr. 5, 2022

(54) PACKAGE AND SUBSTRATE COMPRISING INTERCONNECTS WITH SEMI-CIRCULAR PLANAR SHAPE AND/OR TRAPEZOID PLANAR SHAPE

(71) Applicant: QUALCOMM Incorporated, San Diego, CA (US)

(72) Inventors: Aniket Patil, San Diego, CA (US); Joan Rey Villarba Buot, Escondido, CA (US); Hong Bok We, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 54 days.

(21) Appl. No.: 17/002,615

(22) Filed: Aug. 25, 2020

(65) Prior Publication Data

US 2022/0068798 A1    Mar. 3, 2022

(51) Int. Cl.
*H01L 23/522* (2006.01)
*H01L 21/48* (2006.01)
*H01L 23/528* (2006.01)
*H01L 21/768* (2006.01)

(52) U.S. Cl.
CPC ........ *H01L 23/5226* (2013.01); *H01L 21/486* (2013.01); *H01L 21/76802* (2013.01); *H01L 23/528* (2013.01)

(58) Field of Classification Search
None
See application file for complete search history.

(56) References Cited

U.S. PATENT DOCUMENTS

| | | |
|---|---|---|
| 2013/0057361 A1 | 3/2013 | Sakano et al. |
| 2020/0058626 A1 | 2/2020 | Tai et al. |
| 2021/0366863 A1* | 11/2021 | Wu .................. H01L 24/20 |

FOREIGN PATENT DOCUMENTS

WO    2017094283 A1    6/2017

OTHER PUBLICATIONS

International Search Report and Written Opinion—PCT/US2021/044996—ISA/EPO—dated Nov. 25, 2021.

* cited by examiner

*Primary Examiner* — Hsien Ming Lee
(74) *Attorney, Agent, or Firm* — Loza & Loza, LLP

(57) ABSTRACT

A substrate that includes at least one dielectric layer, a plurality of first interconnects located in the at least one dielectric layer, at least one photo-imageable dielectric layer coupled to the at least one dielectric layer, and a plurality of second interconnects located in the at least one photo-imageable dielectric layer. The plurality of second interconnects includes at least one pair of adjacent interconnects having a centroid to centroid distance that is less than a pitch between the pair of interconnects. The pair of adjacent interconnects may include a pair of adjacent via interconnects and/or a pair of pad interconnects. The substrate may include a coreless substrate or a cored substrate.

29 Claims, 18 Drawing Sheets

PROFILE VIEW

*PROFILE VIEW*

PROFILE VIEW

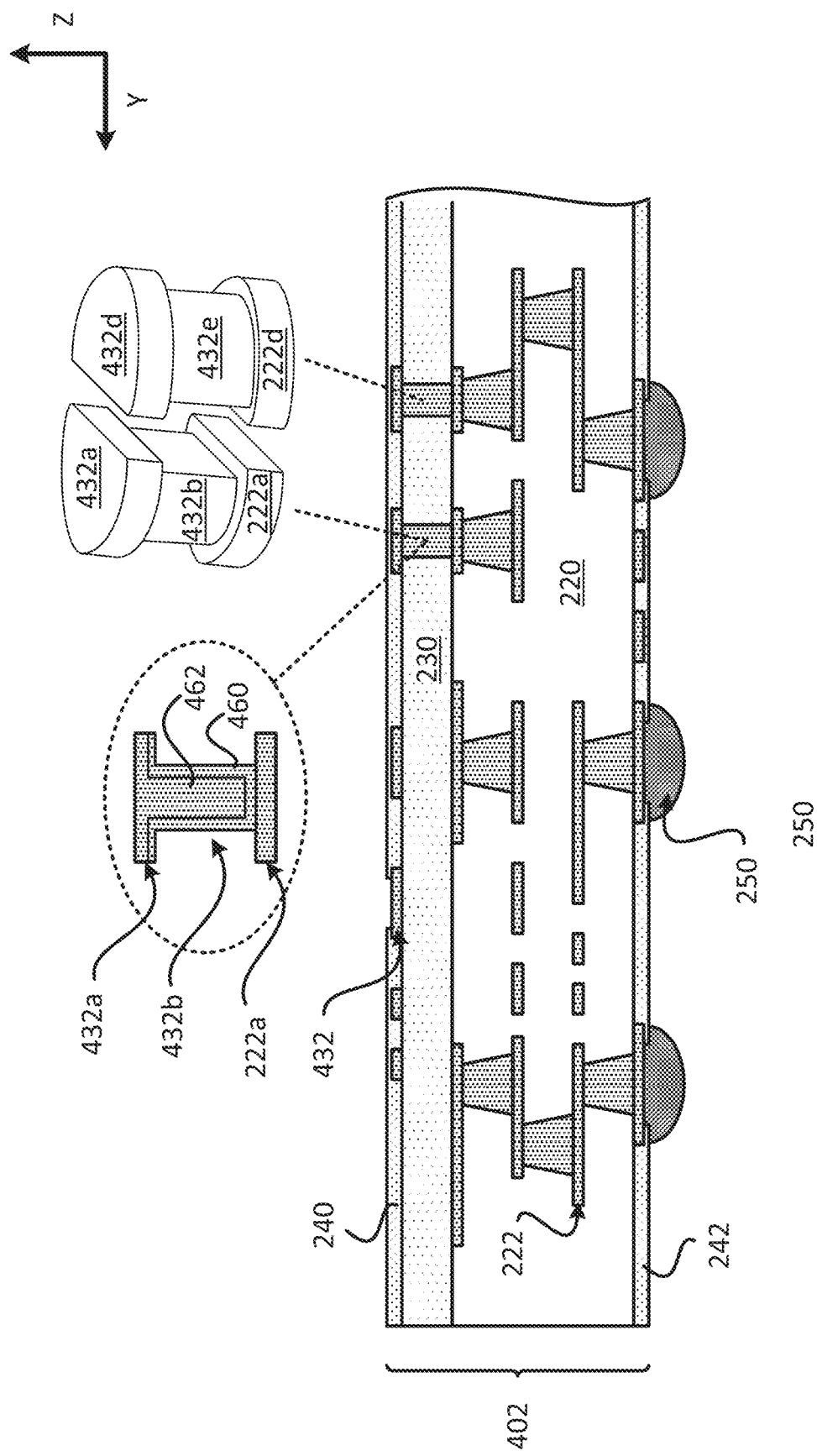

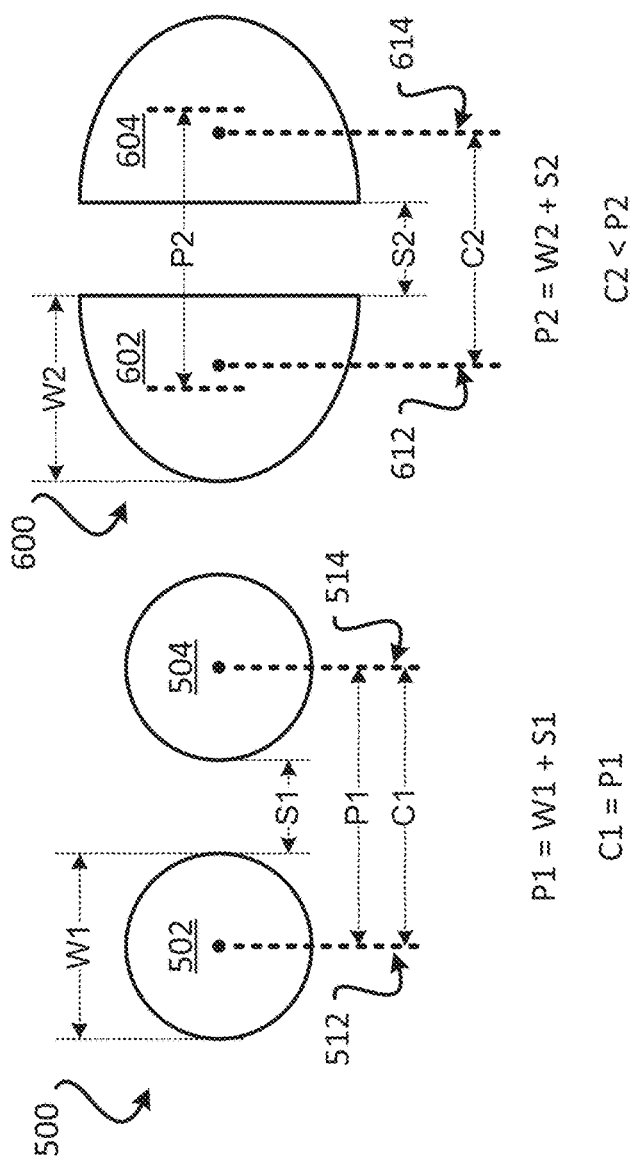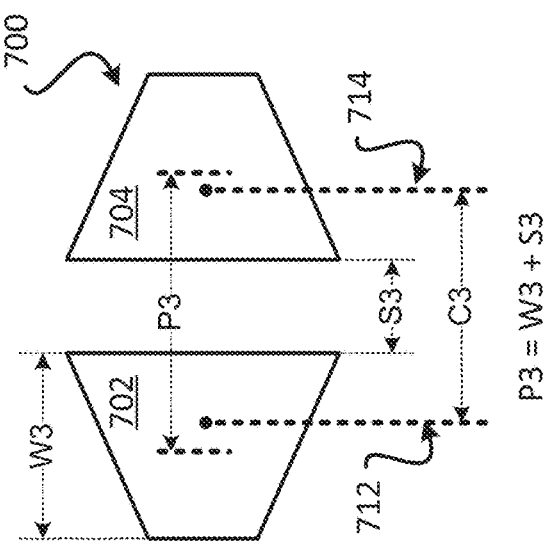

PLAN VIEW

PLAN VIEW

PACKAGE AND SUBSTRATE COMPRISING INTERCONNECTS WITH SEMI-CIRCULAR PLANAR SHAPE AND/OR TRAPEZOID PLANAR SHAPE

FIELD

Various features relate to packages and substrates, but more specifically to a package that includes a substrate that includes interconnects with semi-circular shape and/or trapezoid shape.

BACKGROUND

Interconnects in packages and substrates are subject to minimum pitch and minimum spacing requirements. These minimum pitch and minimum spacing requirements specify how closely interconnects may be to one another within a package and a substrate. These minimum pitch and minimum spacing requirements may limit the performance of the packages. There is an ongoing need to provide better performing packages with an integrated device.

SUMMARY

Various features relate to packages and substrates, but more specifically to a package that includes a substrate that includes interconnects with semi-circular shape and/or trapezoid shape.

One example provides a substrate that includes at least one dielectric layer, a plurality of first interconnects located in the at least one dielectric layer, at least one photo-imageable dielectric layer coupled to the at least one dielectric layer, and a plurality of second interconnects located in the at least one photo-imageable dielectric layer. The plurality of second interconnects includes at least one pair of adjacent via interconnects having a centroid to centroid distance that is less than a pitch between the pair of via interconnects.

Another example provides a substrate that includes at least one dielectric layer, a plurality of first interconnects located in the at least one dielectric layer, at least one photo-imageable dielectric layer coupled to the at least one dielectric layer, and a plurality of second interconnects located in the at least one photo-imageable dielectric layer. The plurality of second interconnects comprises at least one via interconnect having a semi-circular planar shape.

Another example provides an apparatus that includes an integrated device and a substrate coupled to the integrated device. The substrate includes at least one dielectric layer, a plurality of first interconnects located in the at least one dielectric layer, at least one photo-imageable dielectric layer coupled to the at least one dielectric layer, and a plurality of second interconnects located in the at least one photo-imageable dielectric layer. The plurality of second interconnects includes at least one pair of adjacent via interconnects having a centroid to centroid distance that is less than a pitch between the pair of adjacent via interconnects.

Another example provides a method for fabricating a substrate. The method forms at least one dielectric layer. The method forms a plurality of first interconnects in the at least one dielectric layer. The method forms at least one photo-imageable dielectric layer over the at least one dielectric layer. The method forms a plurality of second interconnects in the at least one photo-imageable dielectric layer. Forming the plurality of second interconnects includes forming at least one pair of adjacent interconnects having a centroid to centroid distance that is less than a pitch between the pair of adjacent interconnects.

BRIEF DESCRIPTION OF THE DRAWINGS

Various features, nature and advantages may become apparent from the detailed description set forth below when taken in conjunction with the drawings in which like reference characters identify correspondingly throughout.

FIG. 4 illustrates a profile view of a substrate that includes interconnects with non-circular and non-rectangular planar shapes.

FIG. 5 illustrates a planar view of adjacent interconnects with circular shapes.

FIG. 6 illustrates a planar view of adjacent interconnects with semi-circular shapes.

FIG. 7 illustrates a planar view of adjacent interconnects with trapezoid shapes.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a substrate that includes at least one dielectric layer, a plurality of first interconnects located in the at least one dielectric layer, at least one photo-imageable dielectric layer coupled to the at least one dielectric layer, and a plurality of second interconnects located in the at least one photo-imageable dielectric layer. The plurality of second interconnects includes at least one pair of adjacent interconnects (e.g., adjacent via interconnects, adjacent pad interconnects) having a centroid to centroid distance that is less than a pitch between the pair of adjacent interconnects. The pair of adjacent interconnects may include a pair of adjacent via interconnects and/or a pair of adjacent pad interconnects. The pair of adjacent interconnects may include an interconnect having a non-circular planar shape (e.g., non-full circular planar shape) and a non-rectangular planar shape. For example, the pair of adjacent interconnects may include an interconnect having a semi-circular planar shape or a trapezoid planar shape. The use of the pair of adjacent interconnects may help (i) reduce loss of coupling between interconnects and (ii) increase impedance (Z) for high speed signals. The substrate may be implemented as a coreless substrate or a cored substrate.

Exemplary Substrate Comprising Improved Interconnect Design

Figure 1:
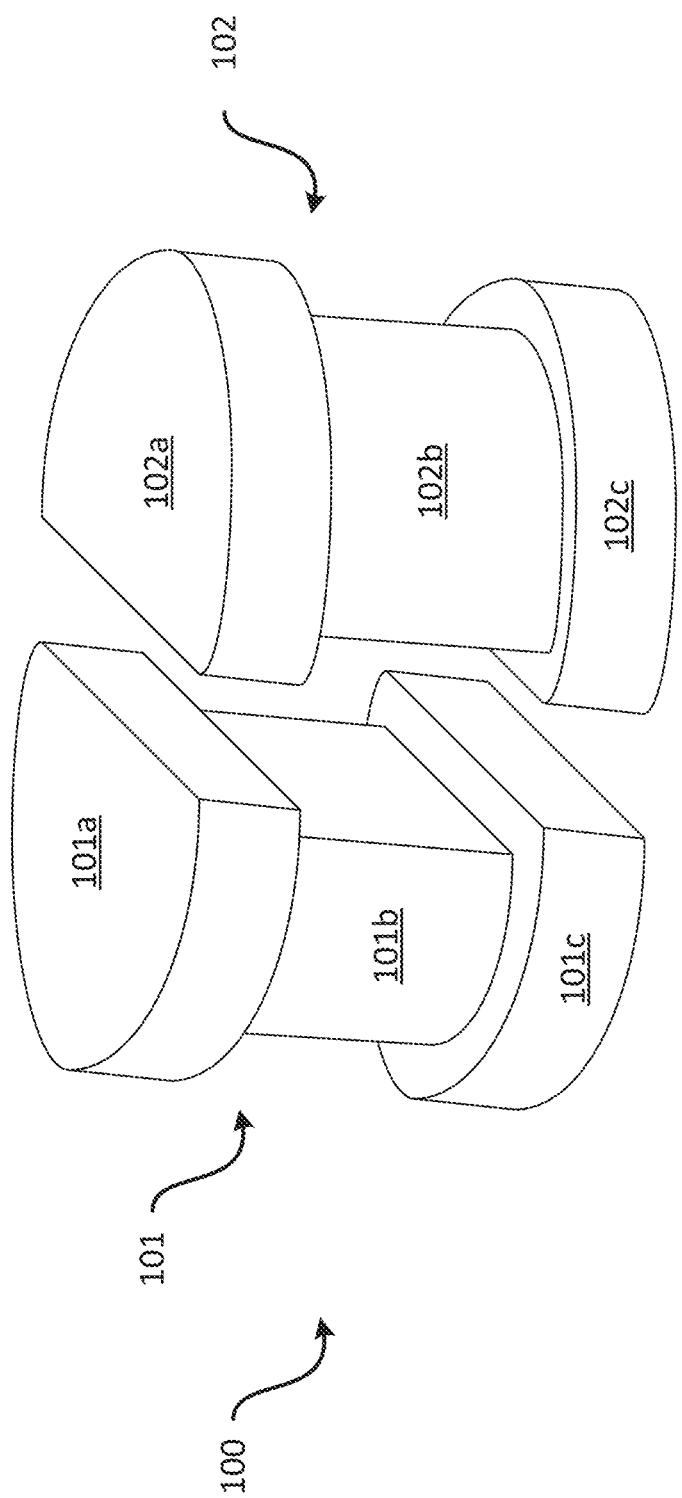
FIG. 1 illustrates a pair of adjacent interconnects with non-circular and non-rectangular planar shapes.

FIG. 1 illustrates a pair of adjacent interconnects 100. The pair of adjacent interconnects 100 includes a first plurality of interconnects 101 and a second plurality of interconnects 102. The first plurality of interconnects 101 includes an interconnect 101a, an interconnect 101b and an interconnect 101c. The interconnect 101b is coupled to the interconnect 101a and the interconnect 101c. The interconnect 101a may be a pad interconnect. The interconnect 101b may be a via interconnect. The interconnect 101c may be a pad interconnect. The interconnect 101a, the interconnect 101b and the interconnect 101c have a semi-circular planar shape (e.g., semi-circular shape along the X-Y plane).

The second plurality of interconnects 102 includes an interconnect 102a, an interconnect 102b and an interconnect 102c. The interconnect 102b is coupled to the interconnect 102a and the interconnect 102c. The interconnect 102a may be a pad interconnect. The interconnect 102b may be a via interconnect. The interconnect 102c may be a pad interconnect. The interconnect 102a, the interconnect 102b and the interconnect 102c have a semi-circular planar shape (e.g., semi-circular shape along the X-Y plane). The semi-circular shapes of the second plurality of interconnects 102 may be a mirror image of the semi-circular shapes of the first plurality of interconnects 101.

The first plurality of interconnects 101 is configured as an electrical path for a first current. The second plurality of interconnects 102 is configured as an electrical path for a second current. In some implementations, the first plurality of interconnects 101 may be part of a first inductor and the second plurality of interconnects 102 may be part of a second inductor. In such instances, a current travelling through the first plurality of interconnects 101 may induce a current in the second plurality of interconnects 102.

The use of interconnects with non-circular shapes (e.g., non-full circular shapes) and non-rectangular shapes provides certain advantages. The physical spacing and pitch between interconnects from a pair of adjacent interconnects (e.g., 100) with non-circular shapes and non-rectangular shapes may be the same as the physical spacing and pitch between interconnects from a pair of adjacent interconnects with circular shapes. However, from an electrical property point of view, the interconnects from a pair of adjacent interconnects (e.g., 100) with non-circular shapes and non-rectangular shapes, are effectively closer than the interconnects from a pair of adjacent interconnects with circular shapes.

As will be further described below, a pair of adjacent interconnects with non-circular shapes and non-rectangular shapes may perform electrically better than a pair of adjacent interconnects with circular planar shapes. For example, the use of a pair of adjacent interconnects (with non-circular shapes and non-rectangular shapes) may help (i) reduce loss of coupling between interconnects, (ii) increase impedance (Z) for high speed signals, (iii) increase cross talk between differential pairs of interconnects, (iv) increase cross talk between singled ended signals, and/or (v) higher loop inductance for power rails.

Figure 2:
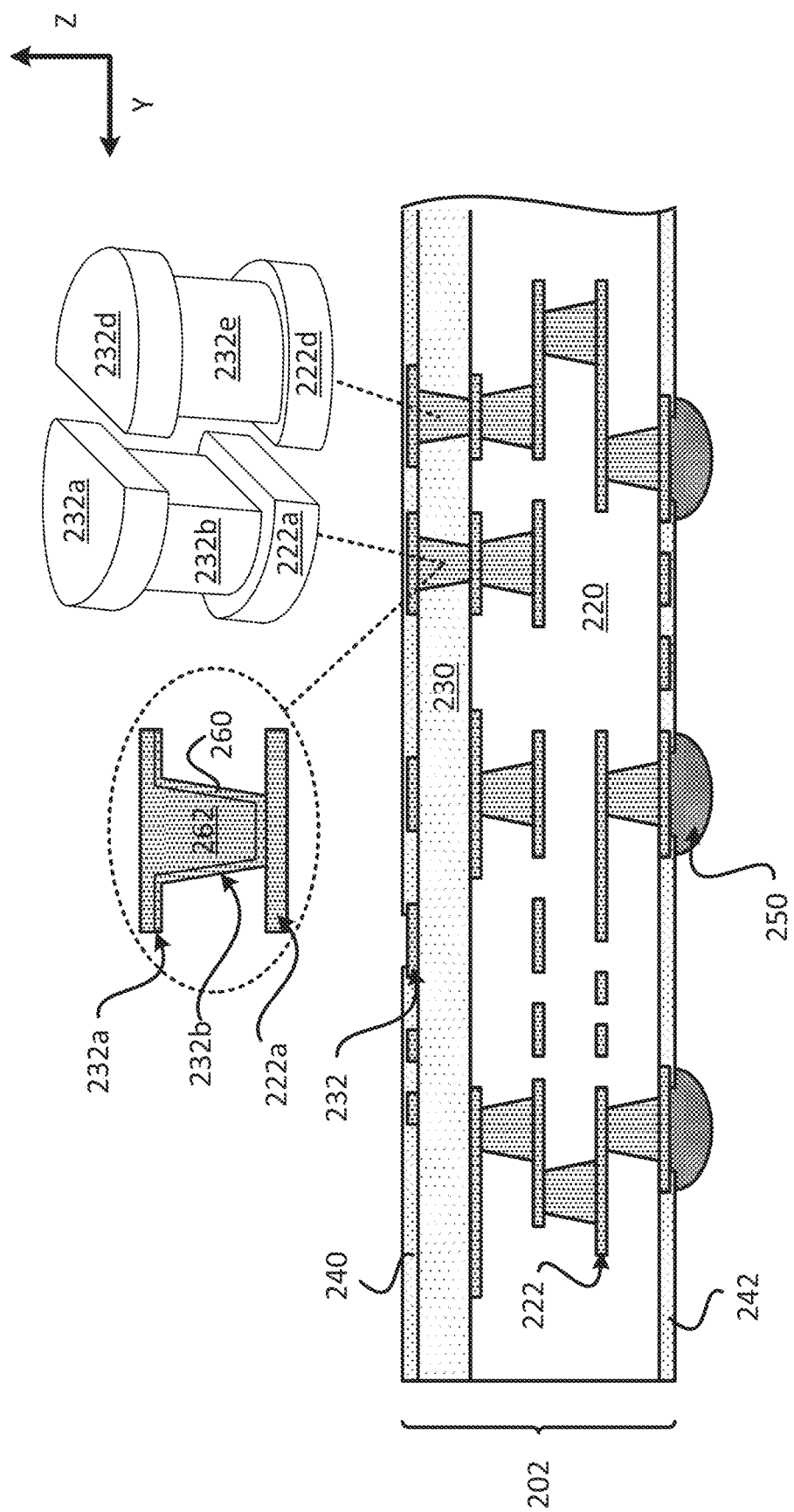
FIG. 2 illustrates a profile view of a substrate that includes interconnects with non-circular and non-rectangular planar shapes.

FIG. 2 illustrates a profile view of a substrate 202 that includes an improved interconnect design. The substrate 202 may include interconnects as described in FIG. 1. The substrate 202 includes at least dielectric layer 220, a plurality of first interconnects 222, at least one photo-imageable dielectric layer 230, a second plurality of interconnects 232, a solder resist layer 240 and a solder resist layer 242. As will be mentioned further below, the substrate 202 may be part of a package that includes an integrated device.

The substrate 202 may be a coreless substrate. The first plurality of interconnects 222 may located in and/or over the at least one dielectric layer 220. The at least one dielectric layer 220 may include prepreg. The at least one photo-imageable dielectric layer 230 may be coupled to the at least one dielectric layer 220. For example, the at least one photo-imageable dielectric layer 230 may include polyimide (PI). The second plurality of interconnects 232 may be located in and/or over the at least one photo-imageable dielectric layer 230. The second plurality of interconnects 232 is configured to be coupled to the first plurality of interconnects 222. The solder resist layer 240 may be coupled to the at least one photo-imageable dielectric layer 230. The solder resist layer 242 may be coupled to the at least one dielectric layer 220. A plurality of solder interconnects 250 may be coupled to the first plurality of interconnects 222.

The second plurality of interconnects 232 includes at least one pair of adjacent interconnects having a centroid to centroid distance that is less than a pitch between the pair of adjacent interconnects. A centroid of an interconnect (e.g., via interconnect, pad interconnect) may be a point or a line that represents a mean position of the interconnect. Thus, a centroid of an interconnect may conceptually represent a position of the interconnect. A centroid of an interconnect may be a position of a center of mass of an interconnect (assuming the interconnect has uniform density). The centroid of an interconnect may be calculated and adjusted for variations in densities in the interconnect. For example, when calculating the mean position of the interconnect, the various densities at different locations in the interconnect may be taken into account. The concept of a centroid, a center, and a pitch for interconnects are further illustrated and described below in at least FIGS. 5-10.

The pair of adjacent interconnects may include a pair of adjacent via interconnects and/or a pair of adjacent pad interconnects (e.g., adjacent via pad interconnects). The pair of adjacent interconnects may have non-circular planar shapes and non-rectangular planar shapes. For example, the pair of adjacent interconnects may have a semi-circular planar shape and/or a trapezoid planar shape. The pair of adjacent interconnects may have asymmetrical (e.g., non-symmetrical) planar shapes with respect to a center axis. A planar shape may be defined along the X-Y plane of the substrate 202.

FIG. 2 illustrates that the substrate 202 includes pad interconnect 232a, via interconnect 232b, pad interconnect 222a, pad interconnect 232d, via interconnect 232e and pad interconnect 222d. The via interconnect 232b is coupled to the pad interconnect 232a and the pad interconnect 222a. The via interconnect 232b is located in the at least one photo-imageable dielectric layer 230. The pad interconnect 232a is located over the at least one photo-imageable dielectric layer 230. The pad interconnects 222a is located in the at least one dielectric layer 220. The pad interconnect 232a and the via interconnect 232b may include a metal layer 260 (e.g., seed layer) and a metal layer 262. However, the pad interconnects 232a and the via interconnects 232b may include a different number of metal layers.

The via interconnect 232e is coupled to the pad interconnect 232d and the pad interconnect 222d. The via interconnect 232e is located in the at least one photo-imageable dielectric layer 230. The pad interconnect 232d is located over the at least one photo-imageable dielectric layer 230. The pad interconnects 222d is located in the at least one dielectric layer 220. The pad interconnect 232d and the via interconnect 232e may be formed in a similar fashion as the pad interconnect 232a and the via interconnect 232b.

The pad interconnect 232a and the pad interconnect 232d may be a pair of adjacent interconnects (e.g., adjacent pad interconnects). The via interconnect 232b and the via interconnect 232e may be a pair of adjacent interconnects (e.g., adjacent via interconnects). The pad interconnect 222a and the pad interconnect 222d may be a pair of adjacent interconnects (e.g., adjacent pad interconnects). In some implementations, the combination of (i) the pad interconnect 232a, the via interconnect 232b and the pad interconnect 222a, and the combination of (ii) the pad interconnect 232d, the via interconnect 232e and the pad interconnect 222d, may be a pair of adjacent interconnects.

At least one pair of adjacent interconnects (e.g., 232b, 232e) has a centroid to centroid distance that is less than a pitch between the pair of adjacent interconnects. The pair of adjacent interconnects (e.g., 232b, 232e) may have non-circular planar shapes and non-rectangular planar shapes. For example, the pair of adjacent interconnects (e.g., 232a, 232d) may have a semi-circular planar shape and/or a trapezoid planar shape. The pair of adjacent interconnects may have asymmetrical (e.g., non-symmetrical) planar shapes with respect to a center axis.

Figure 3:
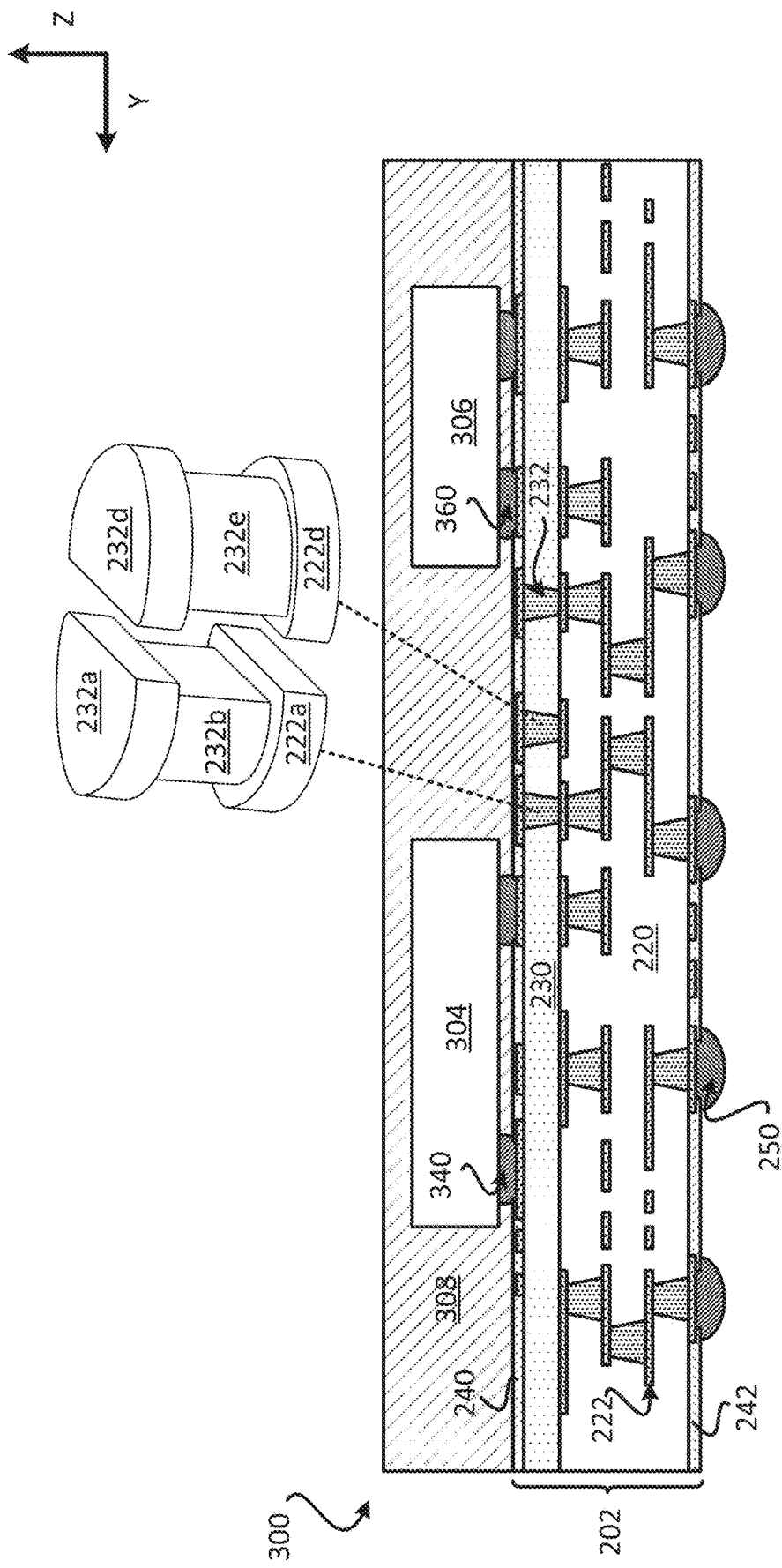
FIG. 3 illustrates a profile view of a package that includes a substrate with interconnects with non-circular and non-rectangular planar shapes.

FIG. 3 illustrates a package 300 that includes a substrate having interconnects with non-circular planar shape interconnects and non-rectangular planar shape interconnects. The package 300 includes the substrate 202, an integrated device 304, an integrated device 306 and an encapsulation layer 308. The integrated device 304 is coupled to a first surface of the substrate 202 through the plurality of solder interconnects 340. The plurality of solder interconnects 340 may be coupled to the second plurality of interconnects 232. The integrated device 306 is coupled to the first surface of the substrate 202 through the plurality of solder interconnects 360. The plurality of solder interconnects 360 may be coupled to the second plurality of interconnects 232. The encapsulation layer 308 is coupled to the first surface of the substrate 202. The encapsulation layer 308 encapsulates the integrated devices 304 and 306. The encapsulation layer 308 may include a mold, a resin and/or an epoxy. The encapsulation layer 308 may be a means for encapsulation.

The substrate 202 includes at least one pair of adjacent interconnects (e.g., 232b, 232e) that has a centroid to centroid distance that is less than a pitch between the pair of adjacent interconnects. The pair of adjacent interconnects (e.g., 232b, 232e) may have non-circular planar shapes and non-rectangular planar shapes. For example, the pair of adjacent interconnects (e.g., 232a, 232d) may have a semi-circular planar shape and/or a trapezoid planar shape. The pair of adjacent interconnects may have asymmetrical (e.g., non-symmetrical) planar shapes with respect to a center axis.

FIG. 4 illustrates a profile view of a substrate 402 that includes an improved interconnect design. The substrate 402 may be a coreless substrate. The substrate 402 may be similar to the substrate 202, and thus may include similar components as the substrate 202. The substrate 402 includes the at least dielectric layer 220, the plurality of first interconnects 222, the at least one photo-imageable dielectric layer 230, a second plurality of interconnects 432, the solder resist layer 240 and the solder resist layer 242. The substrate 402 may be implemented as part of the package 300. The substrate 402 includes via interconnects located in the at least one photo-imageable dielectric layer 230, that have rectangular shapes in the side profile cross section (e.g., along X-Z plane, and/or along Y-Z plane). The via interconnects located in the at least one photo-imageable dielectric layer 203 may have profile shapes that are different than the profile shapes of interconnects located in the at least one dielectric layer 220. The via interconnects in the at least one dielectric layer 220 may have non-rectangular shaped profile shapes (e.g., trapezoid profile shapes).

FIG. 4 illustrates that the substrate 402 includes pad interconnect 432a, via interconnect 432b, pad interconnect 222a, pad interconnect 432d, via interconnect 432e and pad interconnect 222d. The via interconnect 432b is coupled to the pad interconnect 432a and the pad interconnect 222a. The via interconnect 432b is located in the at least one photo-imageable dielectric layer 230. The pad interconnect 432a is located over the at least one photo-imageable dielectric layer 230. The pad interconnects 222a is located in the at least one dielectric layer 220. The pad interconnect 432a and the via interconnect 432b may include a metal layer 460 (e.g., seed layer) and a metal layer 462. However, the pad interconnects 432a and the via interconnects 432b may include a different number of metal layers.

The substrate 402 includes at least one pair of adjacent interconnects (e.g., 432b, 432e) that has a centroid to centroid distance that is less than a pitch between the pair of adjacent interconnects. The pair of adjacent interconnects (e.g., 432b, 432e) may have non-circular planar shapes and non-rectangular planar shapes. For example, the pair of adjacent interconnects (e.g., 432a, 432d) may have a semi-circular planar shape and/or a trapezoid planar shape. The pair of adjacent interconnects may have asymmetrical (e.g., non-symmetrical) planar shapes with respect to a center axis.

The package 300 may include different substrates. The substrate of the package 300 may include a laminate substrate and/or a cored substrate that includes a core layer (e.g., glass, quartz). Thus, different shapes, sizes, arrangements and/or configuration shown in the substrates 202 and 402 may also be implemented in laminate substrate and/or a cored substrate that includes a core layer.

FIG. 5 illustrates an example of a pair of adjacent interconnects 500 that includes a first interconnect 502 that is adjacent (e.g., directly adjacent) to a second interconnect 504. The first interconnect 502 and the second interconnect 504 each have a circular planar shape. The first interconnect 502 and the second interconnect 504 each has a width (W1) (e.g., diameter). The first interconnect 502 is spaced apart from the second interconnect 504 by a spacing (S1). A pitch (P1) between the first interconnect 502 and the second interconnect 504 may be defined by the width (W1)+the spacing (S1). The first interconnect 502 has a centroid 512 and the second interconnect 504 has a centroid 514. For a circular shaped interconnect, a center of an interconnect is equal to a centroid of the interconnect. Since a pitch (P1) may be defined as a center to center distance between a pair of adjacent interconnects, and for circular shaped interconnects, the centroid is equal to the center, the pitch (P1) is equal to a centroid to centroid distance (C1) between first interconnect 502 and the second interconnect 504. A centroid of an interconnect (e.g., via interconnect, pad interconnect) may be a point or a line that represents a mean position of the interconnect. A centroid of an interconnect may represent an equivalent interconnect for the interconnect. The first interconnect 502 and the second interconnect 504 may each represent a pad interconnect and/or a via interconnect.

FIG. 6 illustrates an example of a pair of adjacent interconnects 600 that includes a first interconnect 602 that is adjacent (e.g., directly adjacent) to a second interconnect 604. The first interconnect 602 and the second interconnect 604 each have a semi-circular planar shape. The first interconnect 602 and the second interconnect 604 each has a width (W2). The first interconnect 602 is spaced apart from the second interconnect 604 by a spacing (S2). A pitch (P2) between the first interconnect 602 and the second interconnect 604 may be defined by the width (W2)+the spacing (S2). The first interconnect 602 has a centroid 612 and the second interconnect 604 has a centroid 614. For a semi-circular shaped interconnect, a centroid of an interconnect may be less than a center of the interconnect (depending on how the point of reference is defined). Since the pitch (P2) may be defined as a center to center distance between a pair of adjacent interconnects, and for the semi-circular shaped interconnects, the centroid may be less than the center, the centroid to centroid distance (C2) between first interconnect 602 and the second interconnect 604 is less than the pitch (P2) between first interconnect 602 and the second interconnect 604. The first interconnect 602 and the second interconnect 604 may each represent a pad interconnect and/or a via interconnect.

FIG. 7 illustrates an example of a pair of adjacent interconnects 700 that includes a first interconnect 702 that is adjacent (e.g., directly adjacent) to a second interconnect 704. The first interconnect 702 and the second interconnect 704 each have a trapezoidal planar shape. The first interconnect 702 and the second interconnect 704 each has a width (W3). The first interconnect 702 is spaced apart from the second interconnect 704 by a spacing (S3). A pitch (P3) between the first interconnect 702 and the second interconnect 704 may be defined by the width (W3)+the spacing (S3). The first interconnect 702 has a centroid 712 and the second interconnect 704 has a centroid 714. For a trapezoid shaped interconnect, a centroid of an interconnect may be less than a center of the interconnect (depending on how the point of reference is defined). Since the pitch (P3) may be defined as a center to center distance between a pair of adjacent interconnects, and for the trapezoid shaped interconnects, the centroid may be less than the center, the centroid to centroid distance (C3) between first interconnect 702 and the second interconnect 704 is less than the pitch (P3) between first interconnect 702 and the second interconnect 704. The first interconnect 702 and the second interconnect 704 may each represent a pad interconnect and/or a via interconnect.

The interconnects and pair of interconnects illustrated and described in FIGS. 5, 6 and 7 may be implemented in the substrate 302 and/or the substrate 402. In some implementations, combinations of different shapes may be used in a pair of adjacent interconnects. For example, a circular planar shape interconnect (e.g., 502) may be adjacent to a semi-circular planar shape interconnect (e.g., 604). In another example, a semi-circular planar shape interconnect (e.g., 602) may be adjacent to a trapezoid planar shape interconnect (e.g., 704). In another example, via interconnects and pads that are coupled to the via interconnects may have different shapes. For example, the via interconnect 232b may have a semi-circular planar shape while the pad interconnect 232a may have a circular planar shape. In another example, the via interconnect 232e may have a circular planar shape while the pad interconnect 232d may have a trapezoid planar shape. The above are merely examples of different combinations that may be mixed and matched for interconnects. Other implementations may use other combinations of circular shapes, semi-circular shapes, trapezoid shapes, rectangular shapes, non-rectangular shapes and/or non-circular shapes.

Figure 9:
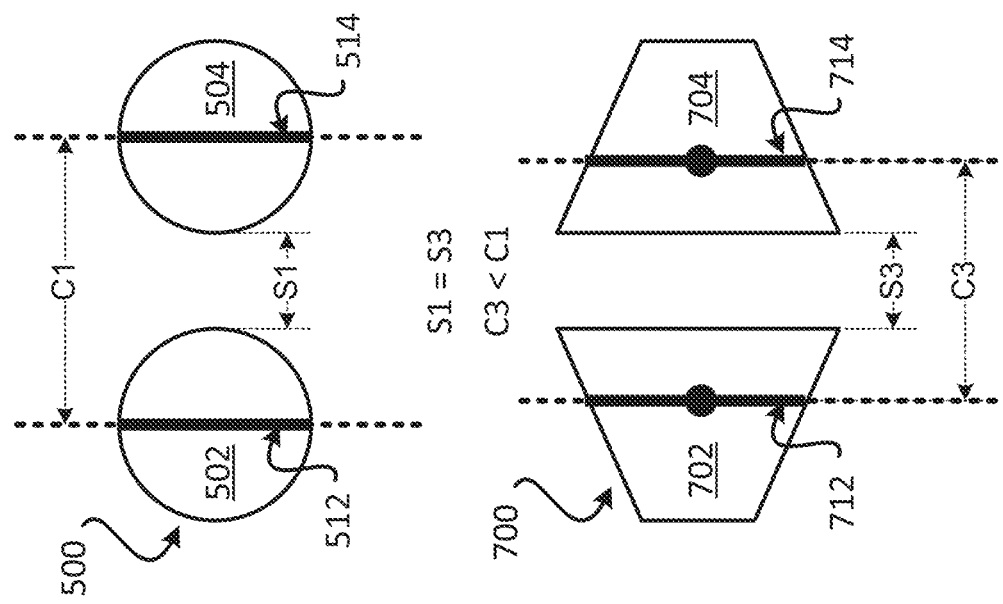
FIG. 9 illustrates an exemplary planar view of centroid for circular-shaped interconnects and trapezoid shaped interconnects.
Figure 8:
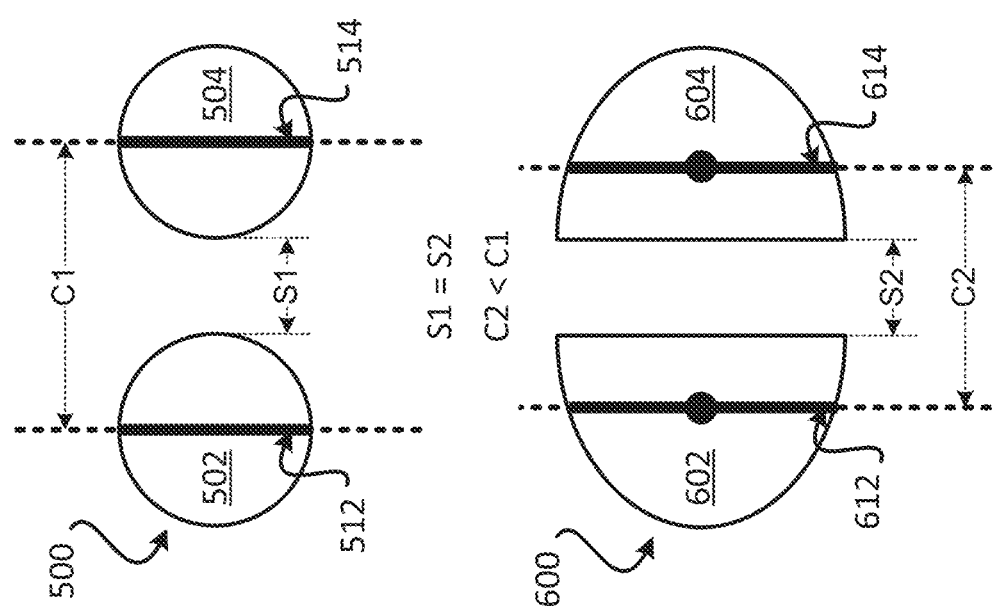
FIG. 8 illustrates an exemplary planar view of centroid for circular-shaped interconnects and semi-circular shaped interconnects.

FIG. 8-9 illustrate the centroids of non-circular planar shaped interconnects and non-rectangular planar shaped interconnects relative to the centroids of circular planar shaped interconnects. FIG. 8 illustrates the centroids of a semi-circular planar shaped interconnects in comparison to the centroids of the circular planar shaped interconnects. The pair of adjacent interconnects 600 has the same spacing and pitch as the pair of adjacent interconnects 500. However, because of the asymmetrical geometry of the first interconnect 602 and the second interconnect, the centroid distance (C2) between the first interconnect 602 and the second interconnect 604, is less than the centroid distance (C1) between the first interconnect 502 and the second interconnect 504. As mentioned above, a centroid of an interconnect (e.g., via interconnect, pad interconnect) may be a point or a line that represents a mean position of the interconnect. Thus, a centroid of an interconnect may conceptually represent a position of the interconnect. A centroid of an interconnect may be a position of a center of mass of an interconnect (assuming the interconnect has uniform density). The centroid of an interconnect may be calculated and adjusted for variations in densities in the interconnect. Moreover, a centroid of an interconnect may conceptually represent from an electrical property point of view, a position of an equivalent interconnect for the interconnect (e.g., if the interconnect is represented as a point or line). FIG. 8 illustrates that adjacent interconnects may be configured to be effectively closer to each other, while still satisfying minimum spacing and minimum pitch requirements. For example, the pair of adjacent interconnects 500 and 700 are both configured to have a minimum spacing and a minimum pitch (e.g., have same spacing and same pitch). However, because of the geometry (e.g., shape) of the pair of adjacent interconnects 600, from an electrical property point of view, the adjacent interconnects 600 are effectively closer to each other. Thus, the centroid to centroid distance between a pair of adjacent interconnects (e.g., adjacent via interconnects, adjacent pad interconnects) may be less than a minimum pitch between the pair of adjacent interconnects (e.g., adjacent via interconnects, adjacent pad interconnects).

In one example, a pair of adjacent interconnects (e.g., 500, 600, 700) may include a first interconnect configured to provide a path for a first electrical current, and a second interconnect configured to provide a path for a second electrical current. The first interconnect is part of a first netlist circuit. The second interconnect is part of a second netlist circuit.

In another example, a pair of adjacent interconnects (e.g., 500, 600, 700) may include a first interconnect configured to provide a path for a first electrical signal, and a second interconnect configured to provide a path for ground.

In another example, a pair of adjacent interconnects (e.g., 500, 600, 700) may include a first via interconnect configured to provide a path for a power, and a second via interconnect configured to provide a path for ground.

In another example, a pair of adjacent interconnects (e.g., 500, 600, 700) may include a first interconnect, and a second interconnect configured to provide a second electrical current, where the second electrical current is configured to induce a first electrical current through the first interconnect.

There are several advantages to having adjacent interconnects to be effectively closer to each other. For example, the use of a pair of adjacent interconnects may help (i) reduce loss of coupling between interconnects, (ii) increase impedance (Z) for high speed signals, (iii) increase cross talk between differential pairs of interconnects, (iv) increase cross talk between singled ended signals, and/or (v) higher loop inductance for power rails.

FIG. 9 illustrates the centroids of a semi-circular planar shaped interconnects in comparison to the centroids of the circular planar shaped interconnects. The pair of adjacent interconnects 700 has the same spacing and pitch as the pair of adjacent interconnects 500. However, because of the asymmetrical geometry of the first interconnect 702 and the second interconnect, the centroid distance (C3) between the first interconnect 702 and the second interconnect 704, is less than the centroid distance (C1) between the first interconnect 502 and the second interconnect 504. FIG. 9 illustrates that adjacent interconnects may be configured to be effectively closer to each other, while still satisfying minimum spacing and minimum pitch requirements. For example, the pair of adjacent interconnects 500 and 700 are both configured to have a minimum spacing and a minimum pitch (e.g., have same spacing and same pitch). However, because of the geometry (e.g., shape) of the pair of adjacent interconnects 700, from an electrical property point of view, the adjacent interconnects 700 are effectively closer to each other. Thus, the centroid to centroid distance between a pair of adjacent interconnects (e.g., adjacent via interconnects, adjacent pad interconnects) may be less than a minimum pitch between the pair of adjacent interconnects (e.g., adjacent via interconnects, adjacent pad interconnects).

Figure 10:
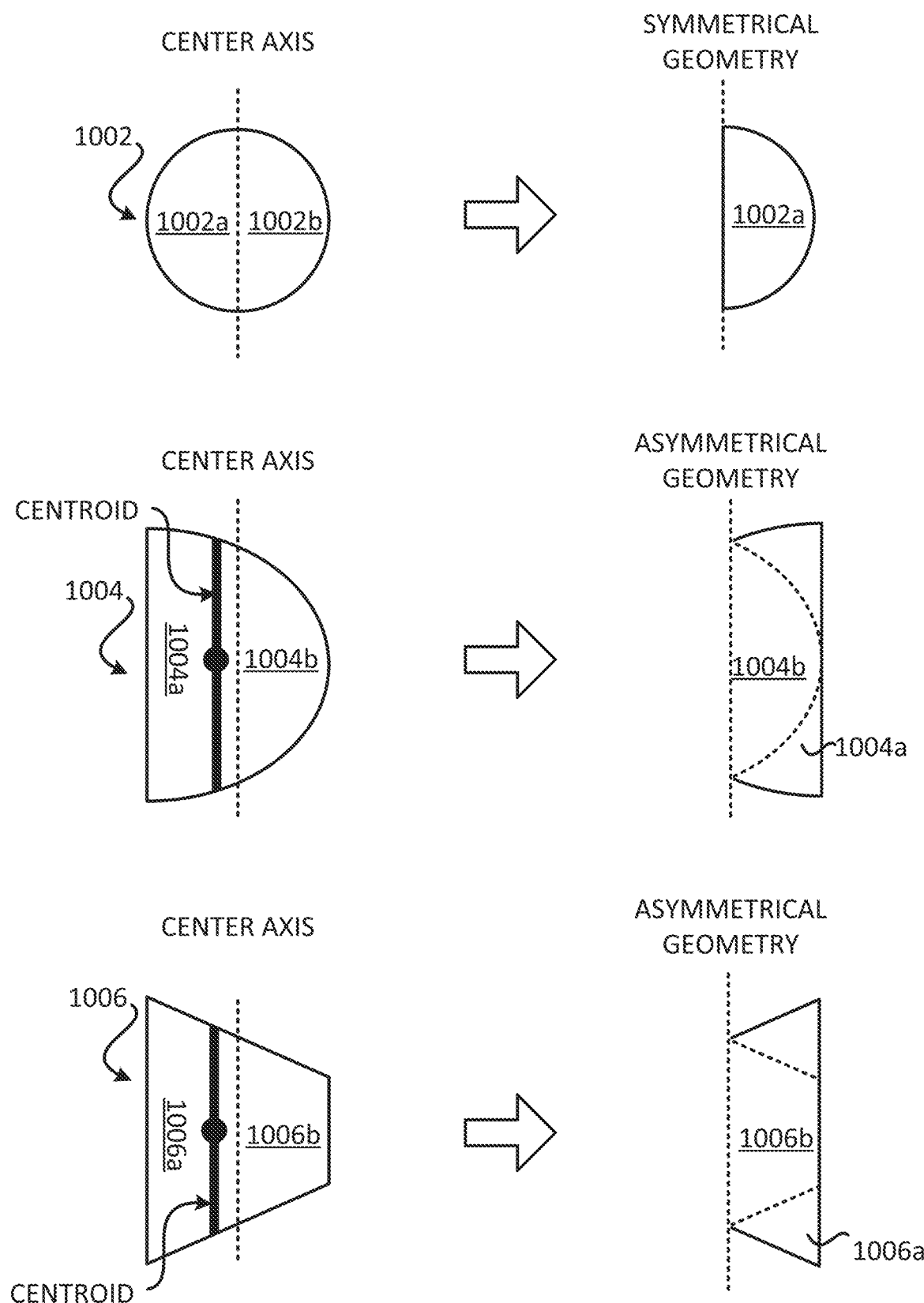
FIG. 10 illustrates exemplary planar view of centroids and center axis for various shapes.

FIG. 10 illustrates various symmetrical and asymmetrical geometries for interconnects. The interconnect 1002 includes a symmetrical circular planar shape that includes a first portion 1002a and a second portion 1002b. The first portion 1002a and the second portion 1002b is divided along a center axis for the interconnect 1002. The center axis may be parallel to an axis that separates an interconnect that is adjacent to the interconnect 1002. When the interconnect 1002 is "folded" along the center axis, the first portion 1002a substantially matches the second portion 1002b.

The interconnect 1004 includes an asymmetrical semi-circular planar shape that includes a first portion 1004a and a second portion 1004b. The first portion 1004a and the second portion 1004b is divided along a center axis for the interconnect 1004. The center axis may be parallel to an axis that separates an interconnect that is adjacent to the interconnect 1004. When the interconnect 1004 is "folded" along the center axis, the first portion 1004a does not match the second portion 1004b.

The interconnect 1006 includes an asymmetrical trapezoid planar shape that includes a first portion 1006a and a second portion 1006b. The first portion 1004a and the second portion 1006b is divided along a center axis for the interconnect 1006. The center axis may be parallel to an axis that separates an interconnect that is adjacent to the interconnect 1006. When the interconnect 1006 is "folded" along the center axis, the first portion 1006a does not match the second portion 1006b.

An integrated device (e.g., 304, 306) may include a die (e.g., bare die). The integrated device may include a radio frequency (RF) device, an analog device, a passive device, a filter, a capacitor, an inductor, an antenna, a transmitter, a receiver, a surface acoustic wave (SAW) filters, a bulk acoustic wave (BAW) filter, a light emitting diode (LED) integrated device, a Silicon (Si) based integrated device, a silicon carbide (SiC) based integrated device, a GaAs based integrated device, a GaN based integrated device, a memory, power management processor, and/or combinations thereof.

Exemplary Sequence for Fabricating a Substrate

In some implementations, fabricating a substrate includes several processes. FIGS. 11A-11F illustrate an exemplary sequence for providing or fabricating a substrate. In some implementations, the sequence of FIGS. 11A-11F may be used to provide or fabricate the substrate 202 of FIG. 2. However, the process of FIGS. 11A-11F may be used to fabricate any of the substrates described in the disclosure. It is noted that other types of substrates may be used instead of the substrate shown in FIGS. 11A-11F.

It should be noted that the sequence of FIGS. 11A-11F may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure.

Figure 11A:
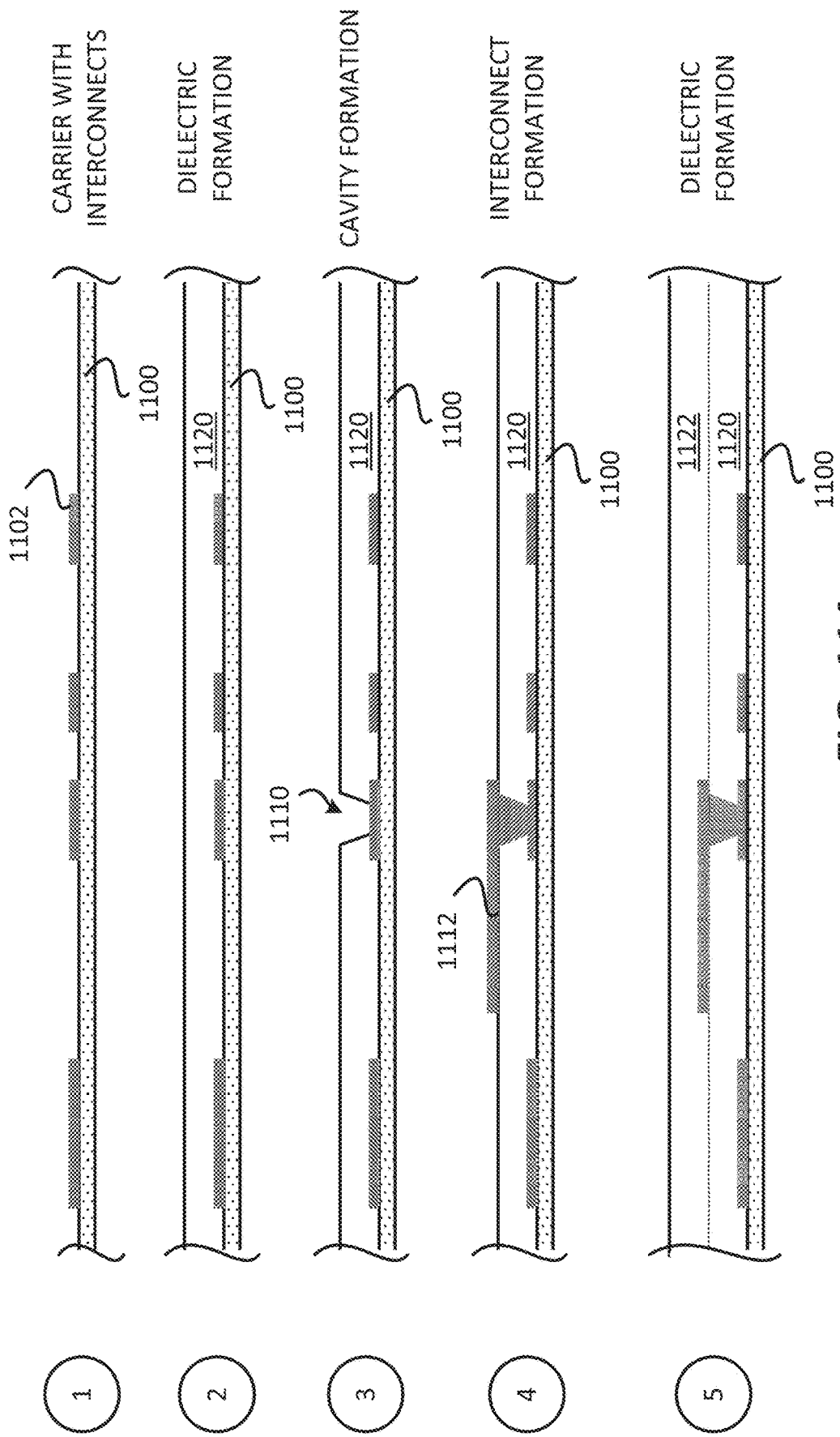
FIGS. 11A-11F illustrate an exemplary sequence for fabricating a substrate.

Stage 1, as shown in FIG. 11A, illustrates a state after a carrier 1100 is provided and a metal layer is formed over the carrier 1100. The metal layer may be patterned to form interconnects 1102. A plating process and etching process may be used to form the metal layer and interconnects.

Stage 2 illustrates a state after a dielectric layer 1120 is formed over the carrier 1100 and the interconnects 1102. A deposition process may be used to form the dielectric layer 1120. The dielectric layer 1120 may include prepreg. However, different implementations may use different materials for the dielectric layer.

Stage 3 illustrates a state after at least one cavity 1110 is formed in the dielectric layer 1120. The at least one cavity 1110 may be formed using an etching process (e.g., photo etching process) or a laser process.

Stage 4 illustrates a state after interconnects 1112 are formed in and over the dielectric layer 1120. For example, a via, pad and/or traces may be formed. A plating process may be used to form the interconnects. The interconnects 1112 may be part of the plurality of interconnects 222.

Stage 5 illustrates a state after another dielectric layer 1122 is formed over the dielectric layer 1120. A deposition process may be used to form the dielectric layer 1122. The dielectric layer 1122 may be the same material as the dielectric layer 1120. However, different implementations may use different materials for the dielectric layer.

Figure 11B:
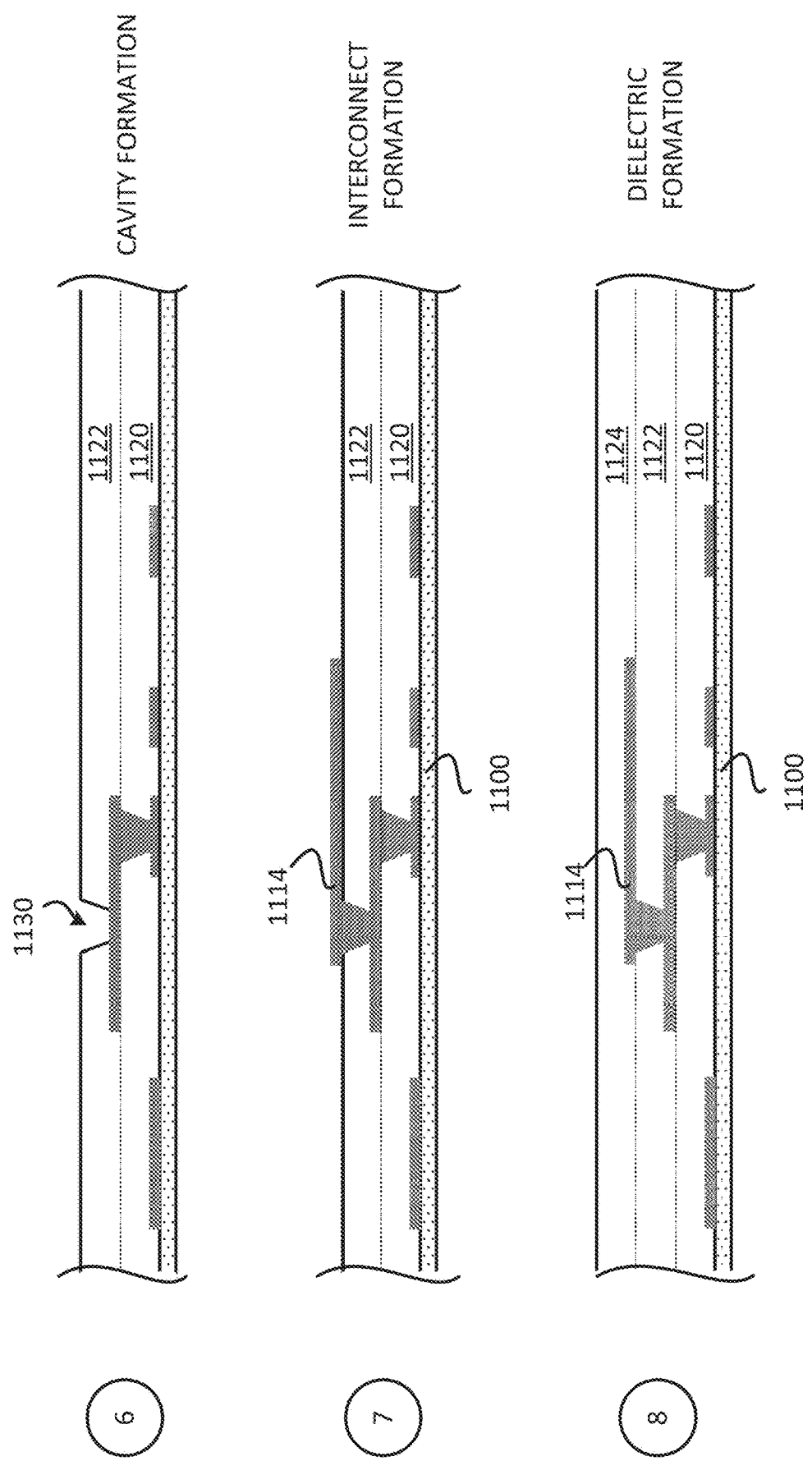

Stage 6, as shown in FIG. 11B, illustrates a state after at least one cavity 1130 is formed in the dielectric layer 1122. An etching process or a laser process may be used to form the at least one cavity 1130.

Stage 7 illustrates a state after interconnects 1114 are formed in and over the dielectric layer 1122. For example, via, pad and/or trace may be formed. A plating process may be used to form the interconnects. The interconnects 1114 may be part of the plurality of interconnects 222.

Stage 8 illustrates a state after another dielectric layer 1124 is formed over the dielectric layer 1122. A deposition process may be used to form the dielectric layer 1124. The dielectric layer 1124 may be the same material as the dielectric layer 1122. However, different implementations may use different materials for the dielectric layer.

Figure 11C:
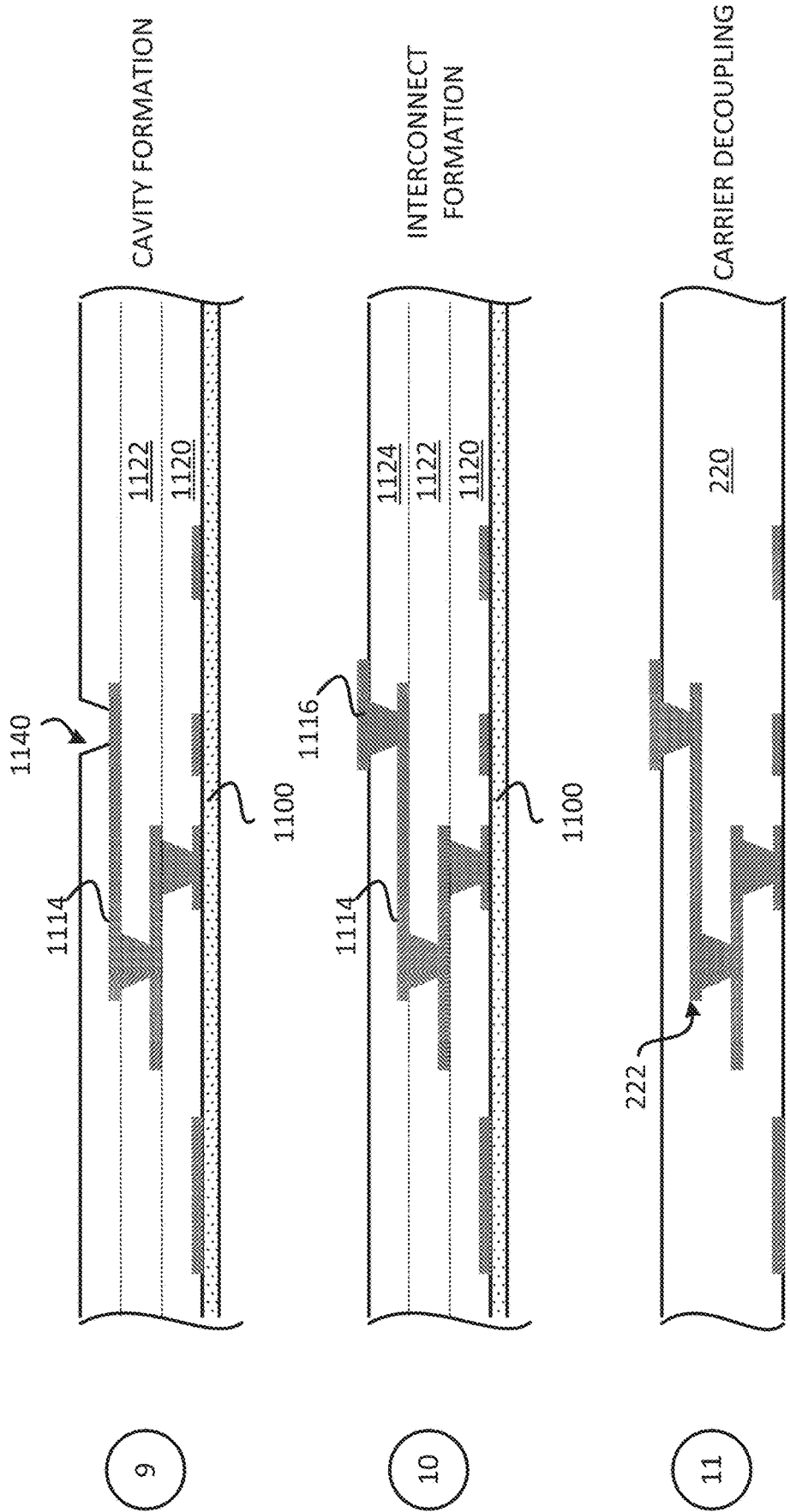

Stage 9, as shown in FIG. 11C, illustrates a state after at least one cavity 1140 is formed in the dielectric layer 1124. An etching process or a laser process may be used to form the at least one cavity 1140.

Stage 10 illustrates a state after interconnects 1116 are formed in and over the dielectric layer 1124. For example, via, pad and/or trace may be formed. A plating process may be used to form the interconnects. The interconnects 1116 may be part of the plurality of interconnects 222.

Stage 11 illustrates a state after the carrier 1100 is decoupled (e.g., removed, grinded out, dissolved) from the at least one dielectric layer 220, leaving the substrate 202. The at least one dielectric layer 220 may represent the dielectric layer 1120, the dielectric layer 1122, and/or the dielectric layer 1124. The plurality of interconnects 222 may represent the plurality of interconnects 1102, 1112, 1114 and/or 1116. Stage 11 may illustrate the substrate 202 of FIG. 2.

Figure 11D:
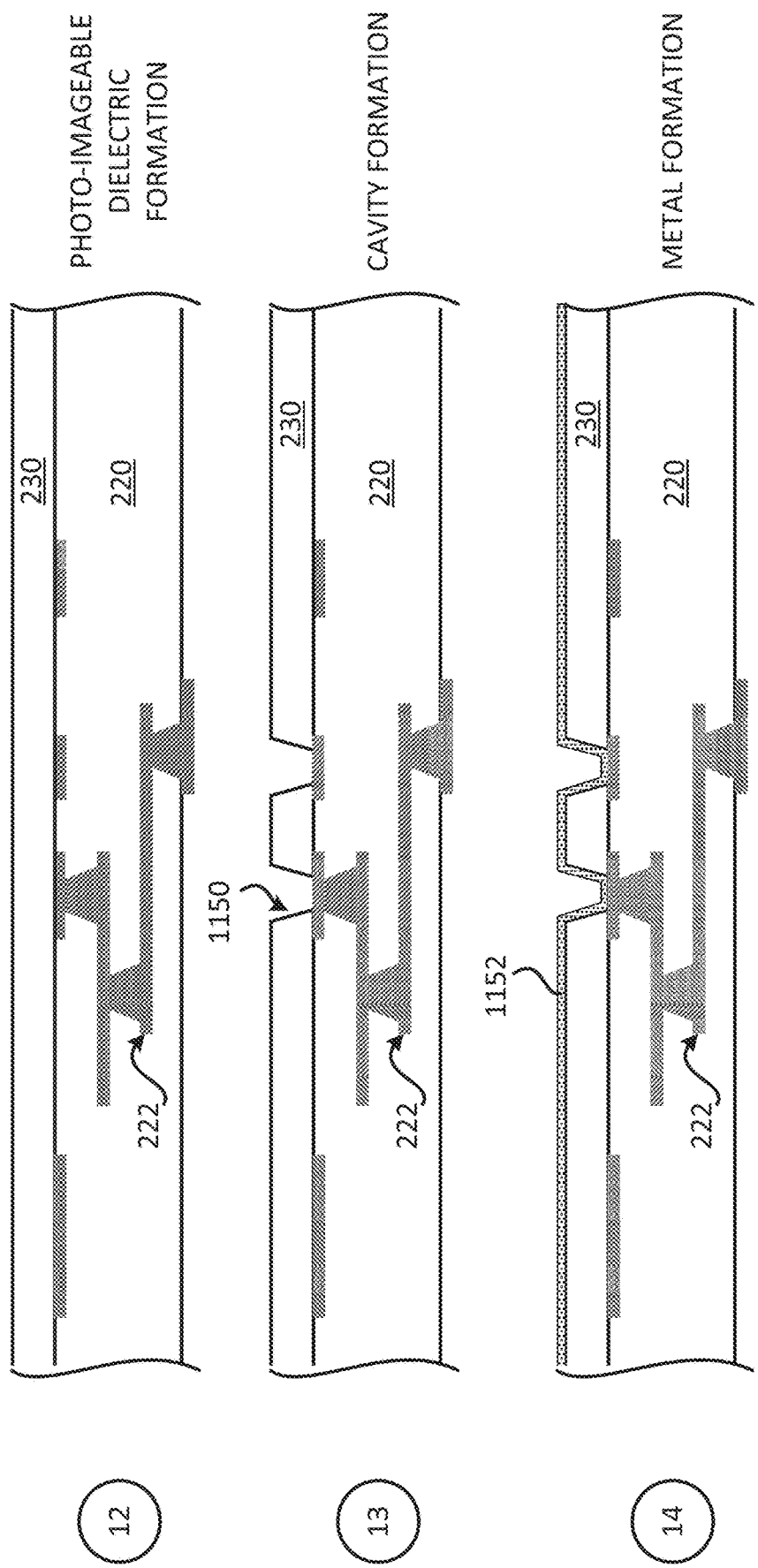

Stage 12, as shown in FIG. 11D, illustrates a state after a photo-imageable dielectric layer 230 is formed over the dielectric layer 220. A deposition process may be used to form the dielectric layer 230. The dielectric layer 230 may be the same material or a different material as the dielectric layer 220. The dielectric layer 203 may include polyimide. However, different implementations may use different materials for the dielectric layer 230.

Stage 13 illustrates a state after at least one cavity 1150 is formed in the dielectric layer 230. A photo etching process may be used to form the at least one cavity 1150.

Stage 14 illustrates a state after a metal layer 1152 is formed in and over the dielectric layer 230. A plating process (e.g., electroless plating process) may be used to form the metal layer 1152.

Figure 11E:
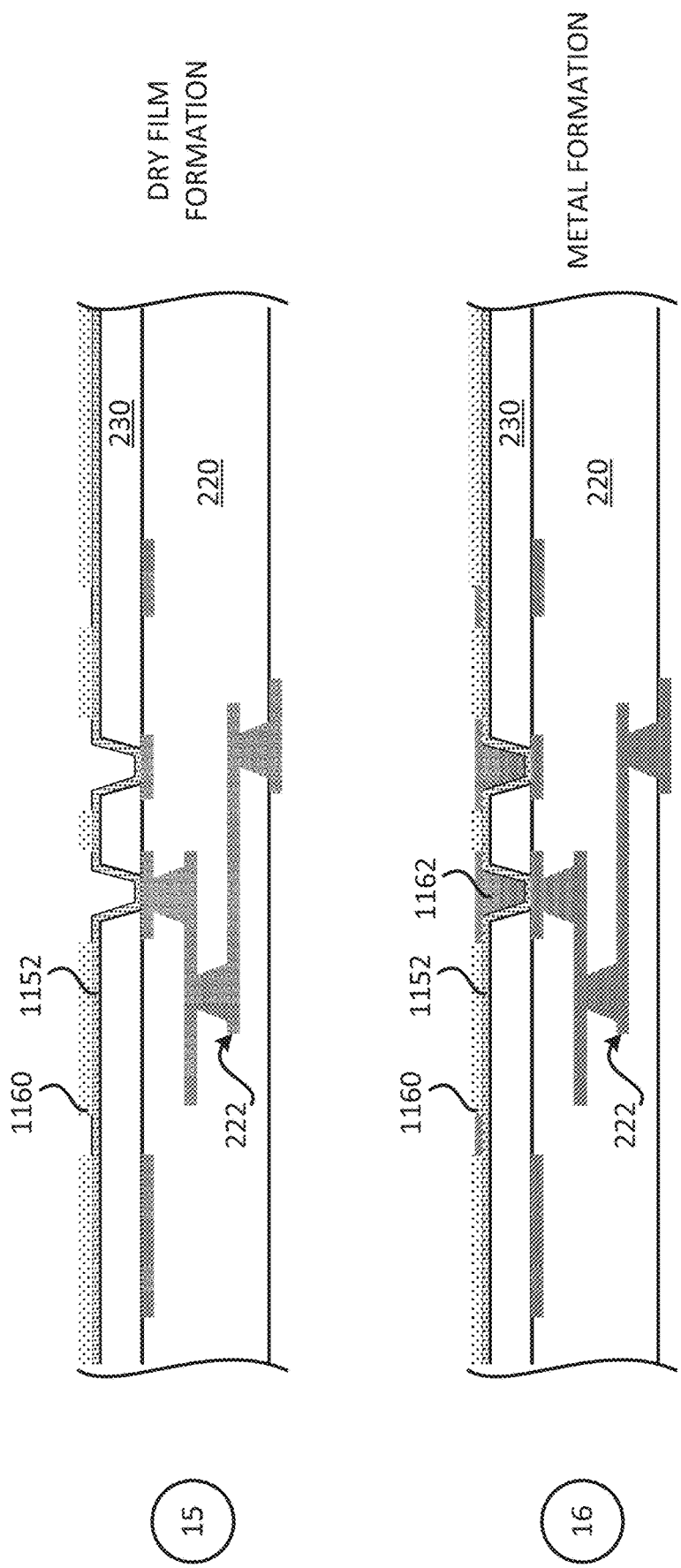

Stage 15, as shown in FIG. 11E, illustrates a state after a dry film 1160 is disposed (e.g. formed) over the metal layer 1152. The dry film 1160 may include a dry film resist (DFR). Forming the dry film 1160 may include a lamination process, an exposure process and a develop process.

Stage 16 illustrates a state after a metal layer 1162 is formed over the metal layer 1152. A plating process may be used to form the metal layer 1162. The combination of the metal layer 1152 and the metal layer 1162 may form a plurality of interconnects 232.

Figure 11F:
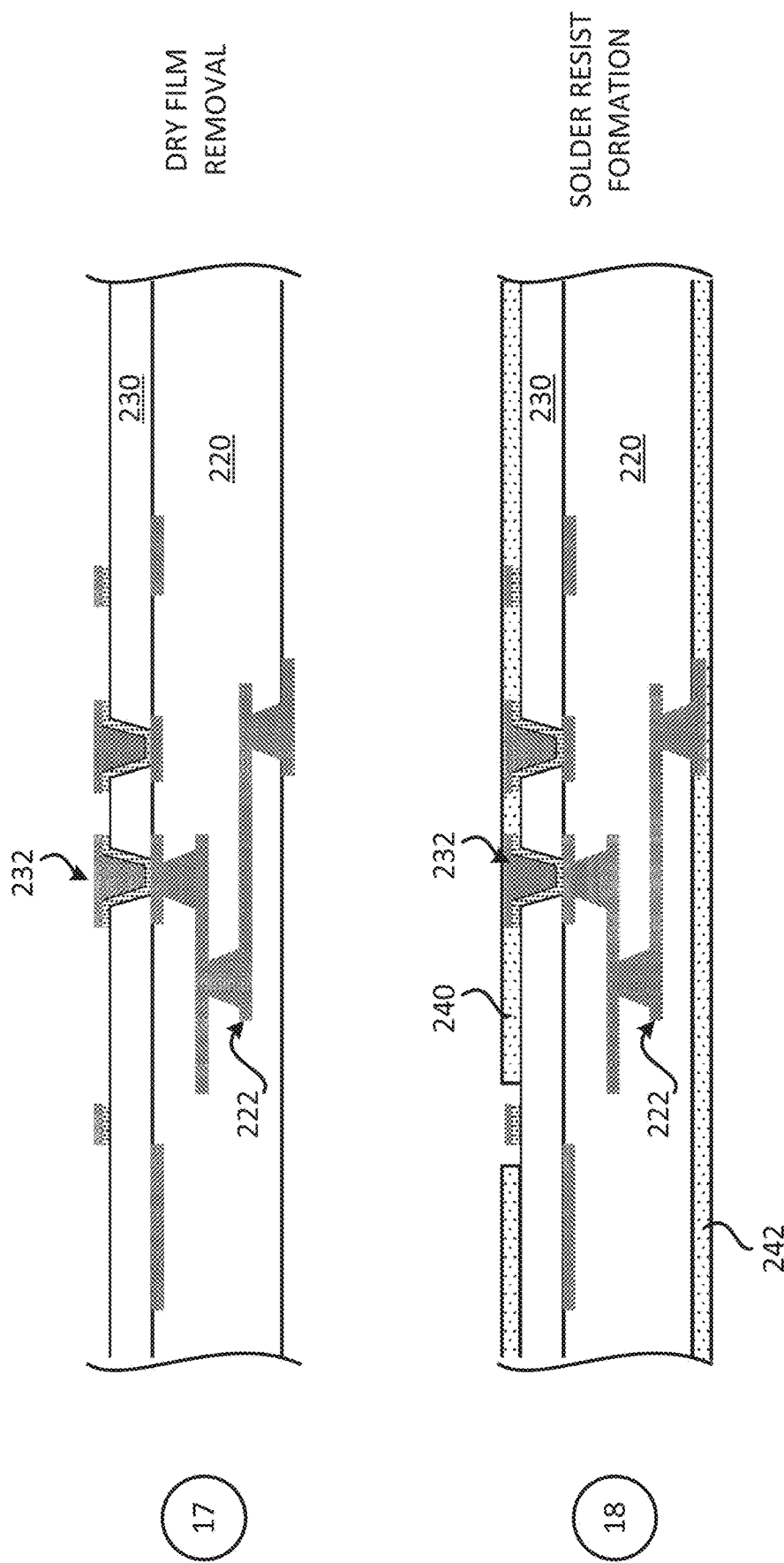

Stage 17, as shown in FIG. 11F, illustrates a state after the dry film 1160 is removed. A stripping process and an etching process may be used to remove the dry film 1160 and portions of the metal layer 1152.

Stage 18 illustrates a state after solder resist layers 240 and 242 are formed. A lamination process, an exposure process and a develop process may be used to form the solder resist layers 240 and 242 over surface of the substrate 202. The solder resist layer 240 may be formed over the photo-imageable dielectric layer 230 and the plurality of interconnects 432. The solder resist layer 242 may be formed over the at least one dielectric layer 220.

Exemplary Sequence for Fabricating a Substrate

Figure 12A:
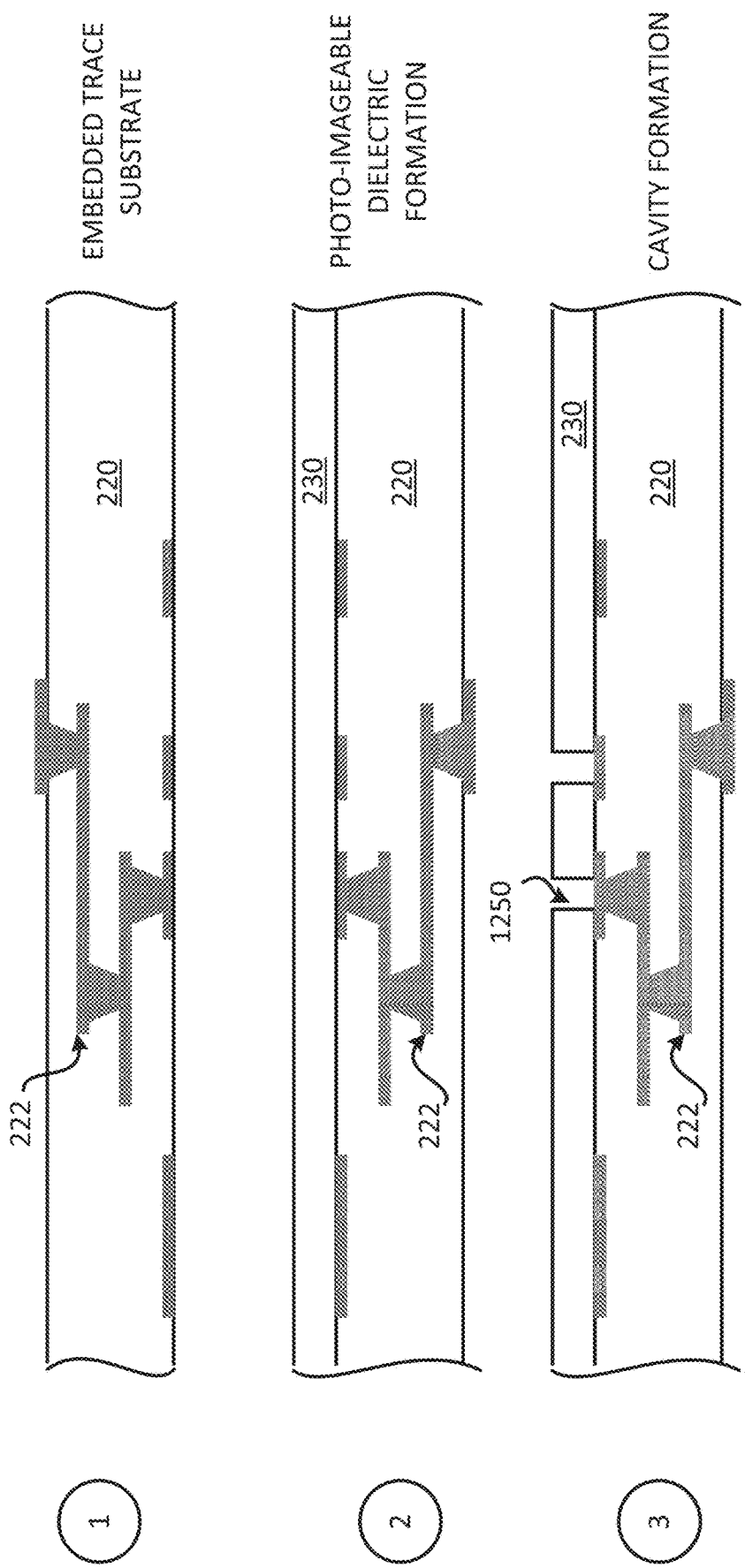
FIGS. 12A-12C illustrate an exemplary sequence for fabricating a substrate.
Figure 12B:
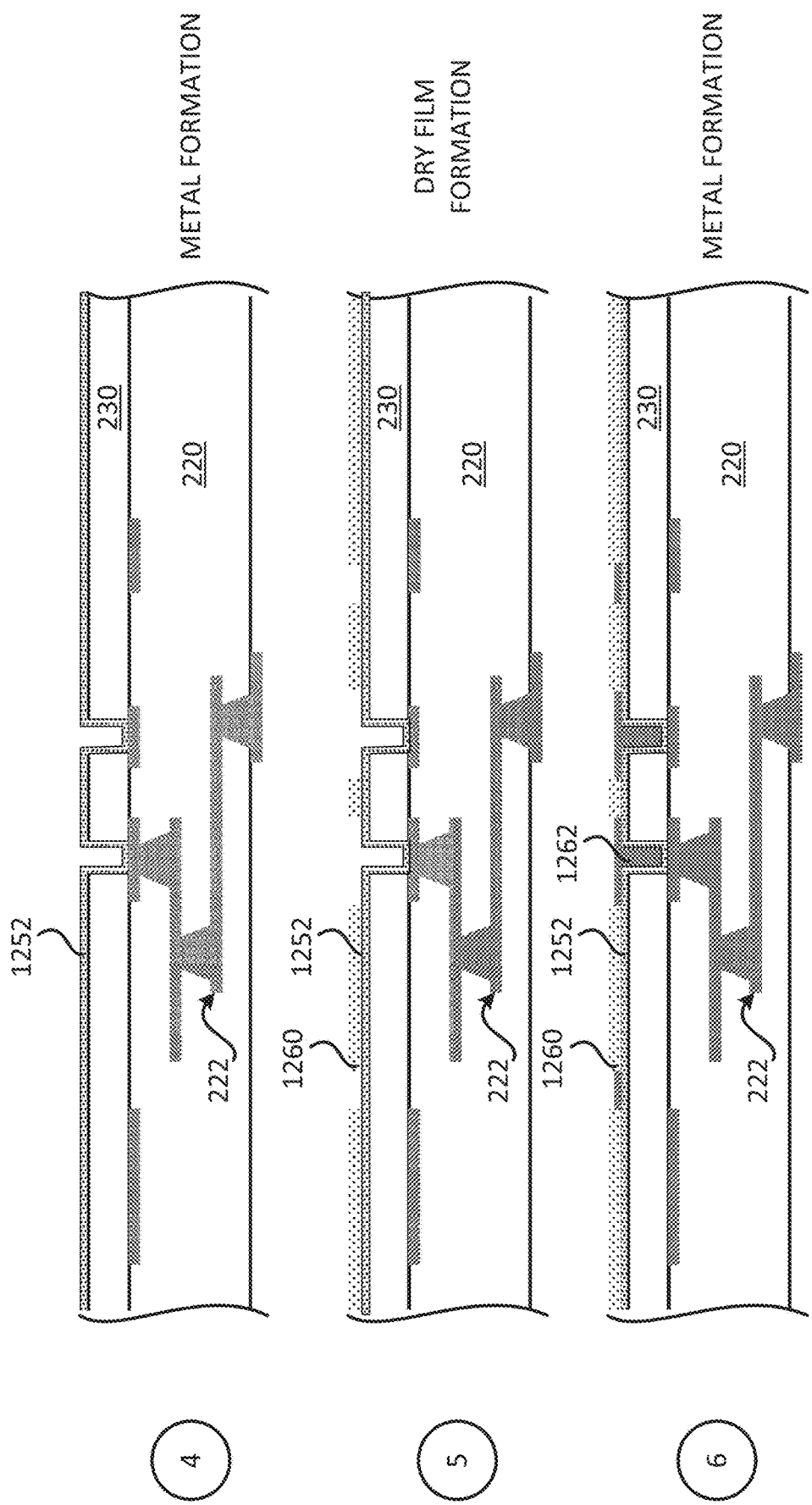
Figure 12C:
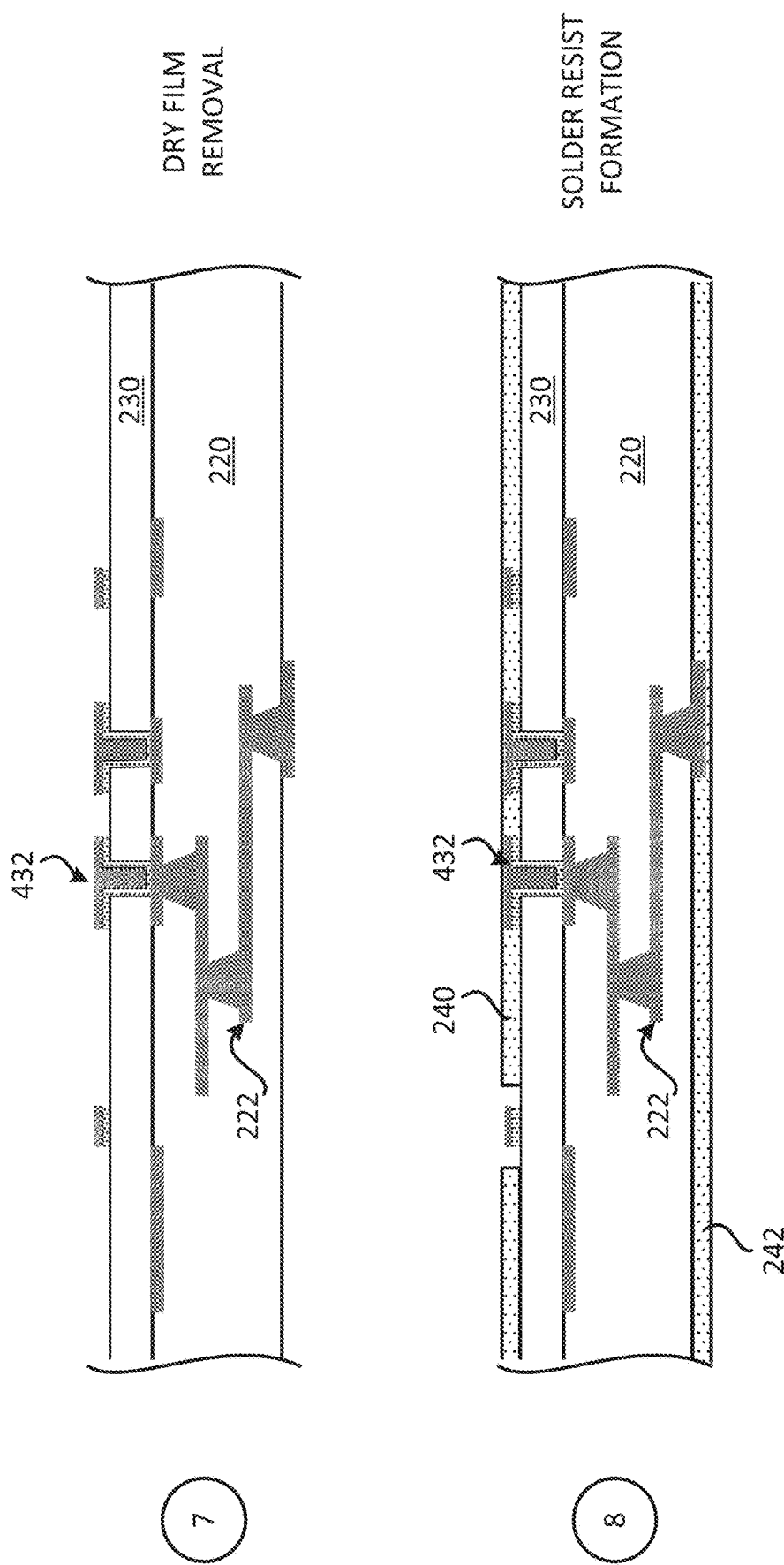

In some implementations, fabricating a substrate includes several processes. FIGS. 12A-12C illustrate an exemplary sequence for providing or fabricating a substrate. In some implementations, the sequence of FIGS. 12A-12C may be used to provide or fabricate the substrate 402 of FIG. 4. However, the process of FIGS. 12A-12C may be used to fabricate any of the substrates described in the disclosure. It is noted that other types of substrates may be used instead of the substrate shown in FIGS. 12A-12C.

It should be noted that the sequence of FIGS. 12A-12C may combine one or more stages in order to simplify and/or clarify the sequence for providing or fabricating a substrate. In some implementations, the order of the processes may be changed or modified. In some implementations, one or more of processes may be replaced or substituted without departing from the spirit of the disclosure.

Stage 1, as shown in FIG. 12A, illustrates a state a substrate is provided. The substrate includes at least one dielectric layer 220 and a plurality of interconnects 222. The substrate may be fabricated or provided by a supplier. Stages 1-11 of FIGS. 11A-11C illustrates and describes an example of fabricating a substrate that includes at least one dielectric layer 220 and a plurality of interconnects 222. Different implementations may provide different substrates. For example, the substrate may include a different number of metal layers. In another example, the substrate may include a cored substrate that includes a core layer (e.g., glass, quartz).

Stage 2, illustrates a state after a photo-imageable dielectric layer 230 is formed over the dielectric layer 220. A deposition process may be used to form the dielectric layer 230. The dielectric layer 230 may be the same material or a different material as the dielectric layer 220. The dielectric layer 203 may include polyimide. However, different implementations may use different materials for the dielectric layer 230.

Stage 3 illustrates a state after at least one cavity 1250 is formed in the dielectric layer 230. A photo etching process may be used to form the at least one cavity 1250. The cavity 1250 may have substantially vertical walls.

Stage 4, as shown in FIG. 12B, illustrates a state after a metal layer 1252 is formed in and over the dielectric layer 230. A plating process (e.g., electroless plating process) may be used to form the metal layer 1252.

Stage 5 illustrates a state after a dry film 1260 is disposed (e.g. formed) over the metal layer 1252. The dry film 1260 may include a dry film resist (DFR). Forming the dry film 1260 may include a lamination process, an exposure process and a develop process.

Stage 6 illustrates a state after a metal layer 1262 is formed over the metal layer 1252. A plating process may be used to form the metal layer 1262. The combination of the metal layer 1252 and the metal layer 1262 may form a plurality of interconnects 432.

Stage 7, as shown in FIG. 12C, illustrates a state after the dry film 1260 is removed. A stripping process and an etching process may be used to remove the dry film 1260 and portions of the metal layer 1252.

Stage 8 illustrates a state after solder resist layers 240 and 242 are formed. A lamination process, an exposure process and a develop process may be used to form the solder resist layers 240 and 242 over surface of the substrate 402. The solder resist layer 240 may be formed over the photo-imageable dielectric layer 230 and the plurality of interconnects 432. The solder resist layer 242 may be formed over the at least one dielectric layer 220.

Exemplary Flow Diagram of a Method for Fabricating a Substrate

Figure 13:
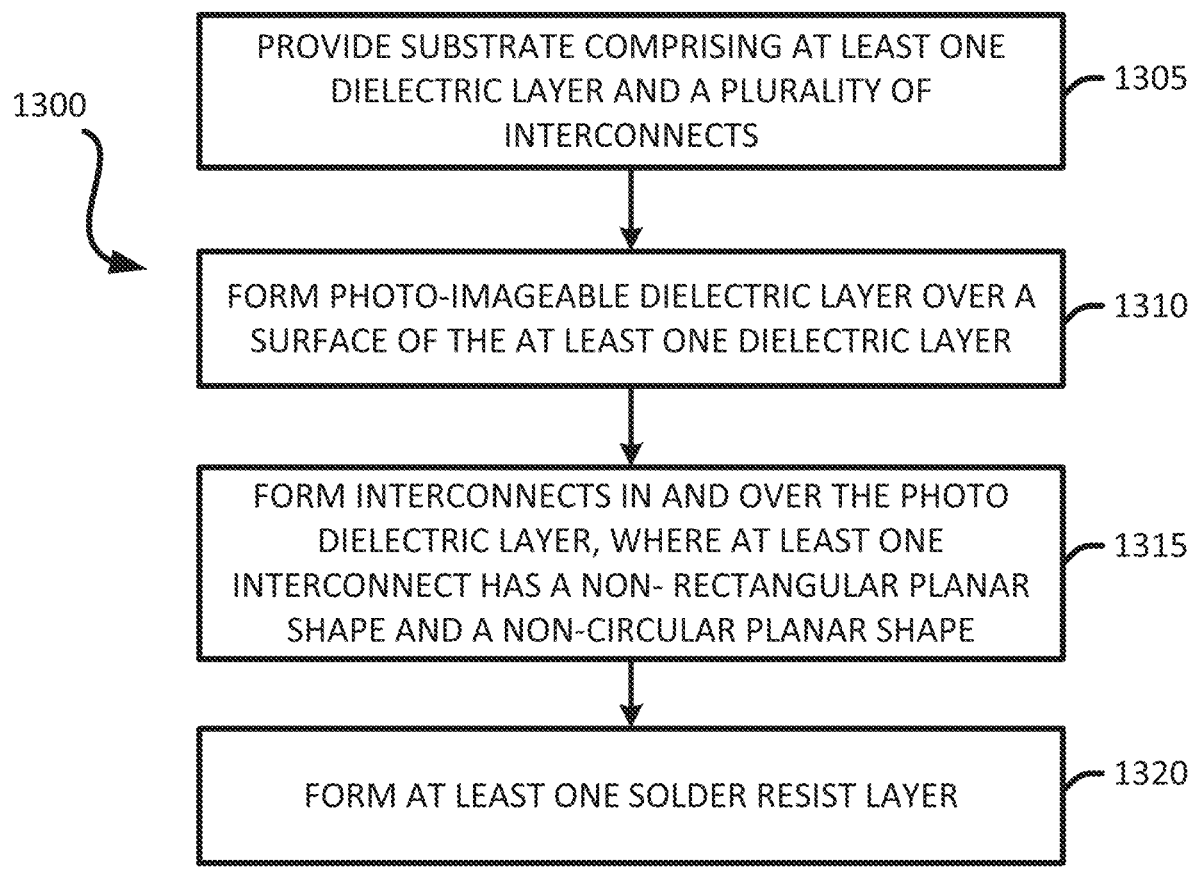
FIG. 13 illustrates an exemplary flow diagram of a method for fabricating a substrate.

In some implementations, fabricating a substrate includes several processes. FIG. 13 illustrates an exemplary flow diagram of a method 1300 for providing or fabricating a substrate. In some implementations, the method 1300 of FIG. 13 may be used to provide or fabricate the substrate 202 of FIG. 2, or any of the substrates described in the disclosure.

It should be noted that the method of FIG. 13 may combine one or more processes in order to simplify and/or clarify the method for providing or fabricating a substrate. In some implementations, the order of the processes may be changed or modified.

The method provides (at 1305) a substrate that includes at least one dielectric layer and a plurality of interconnects. Stages 1-11 of FIGS. 11A-11C illustrates and describes an example of fabricating a substrate that includes at least one dielectric layer 220 and a plurality of interconnects 222. Different implementations may provide different substrates. For example, the substrate may include a different number of metal layers. In another example, the substrate may include a cored substrate that includes a core layer (e.g., glass, quartz).

The method forms (at 1310) at least one photo-imageable dielectric layer (e.g., 230) over the at least one dielectric layer 220. A deposition process may be used to form the dielectric layer 230. The dielectric layer 230 may be the same material or a different material as the dielectric layer 220. The dielectric layer 203 may include polyimide. However, different implementations may use different materials for the dielectric layer 230. Stage 12 of FIG. 11C illustrates and describes an example of forming at least one photo-imageable dielectric layer.

The method forms (at 1315) a plurality of interconnects (e.g., 232) in and over the at least one photo-imageable dielectric layer 230. At least one of the interconnects has a non-rectangular planar shape and a non-circular planar shape. At least one of the interconnects may have a trapezoid planar shape and/or a semi-circular planar shape. At least one pair of adjacent interconnects (e.g., 232b, 232e) has a centroid to centroid distance that is less than a pitch between the pair of adjacent interconnects. The pair of adjacent interconnects (e.g., 232b, 232e) may have non-circular planar shapes and non-rectangular planar shapes. For example, the pair of adjacent interconnects (e.g., 232a, 232d) may have a semi-circular planar shape and/or a trapezoid planar shape. The pair of adjacent interconnects may have asymmetrical (e.g., non-symmetrical) planar shapes with respect to a center axis. Stages 13-17 of FIGS. 11C-11F illustrates and describes an example of forming a plurality of interconnects in and over the at least one photo-imageable dielectric layer 230.

The method forms (at 1320) at least one solder resist layer (e.g., 240, 242) over a dielectric layer (e.g., 220, 230). A lamination process, an exposure process and a develop process may be used to form the solder resist layers 240 and 242 over surface of the substrate 202. The solder resist layer 240 may be formed over the photo-imageable dielectric layer 230 and the plurality of interconnects 232. The solder resist layer 242 may be formed over the at least one dielectric layer 220. Stage 18 of FIG. 11F illustrates and describes an example of forming at least one solder resist layer.

Exemplary Electronic Devices

Figure 14:
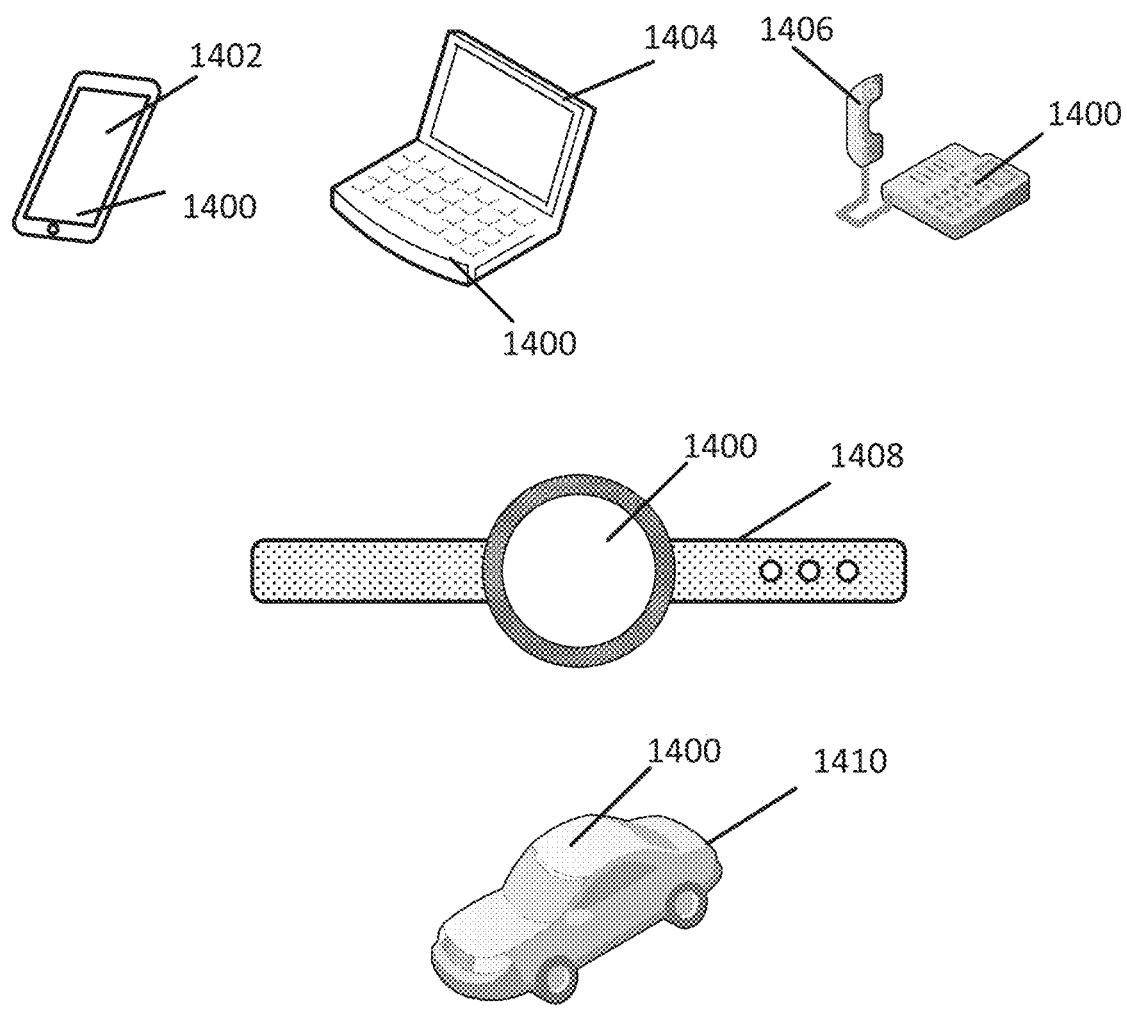
FIG. 14 illustrates various electronic devices that may integrate a die, an integrated device, an integrated passive device (IPD), a passive component, a package, and/or a device package described herein.

FIG. 14 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1402, a laptop computer device 1404, a fixed location terminal device 1406, a wearable device 1408, or automotive vehicle 1410 may include a device 1400 as described herein. The device 1400 may be, for example, any of the devices and/or integrated circuit (IC) packages described herein. The devices 1402, 1404, 1406 and 1408 and the vehicle 1410 illustrated in FIG. 14 are merely exemplary. Other electronic devices may also feature the device 1400 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-10, 11A-11F, 12A-12B and/or 13-14 may be rearranged and/or combined into a single component, process, feature or function or embodied in several components, processes, or functions. Additional elements, components, processes, and/or functions may also be added without departing from the disclosure. It should also be noted FIGS. 1-10, 11A-11F, 12A-12B and/or 13-14 and its corresponding description in the present disclosure is not limited to dies and/or ICs. In some implementations, FIGS. 1-10, 11A-11F, 12A-12B and/or 13-14 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A substrate comprising:
at least one dielectric layer;
a plurality of first interconnects located in the at least one dielectric layer;
at least one photo-imageable dielectric layer coupled to the at least one dielectric layer; and
a plurality of second interconnects located in the at least one photo-imageable dielectric layer, the plurality of second interconnects comprising at least one pair of adjacent via interconnects having a centroid to centroid distance that is less than a pitch between the pair of adjacent via interconnects.

2. The substrate of claim 1, wherein a centroid of a via interconnect from the at least one pair of adjacent via interconnects is a position of a center of mass of the via interconnect.

3. The substrate of claim 1, wherein a centroid of a via interconnect from the at least one pair of adjacent via interconnects is a point or line that represents a mean position of the via interconnect.

4. The substrate of claim 1, wherein the pitch between the pair of adjacent via interconnects is a center to center distance between the pair of adjacent via interconnects.

5. The substrate of claim 1, wherein the pair of adjacent via interconnects includes a via interconnect having a semi-circular planar shape and/or a trapezoid planar shape.

6. The substrate of claim 1,
wherein the plurality of second interconnects further comprises at least one pair of adjacent pad interconnects having a centroid to centroid distance that is less than a pitch between the pair of adjacent pad interconnects, and
wherein the pair of adjacent pad interconnects is coupled to the pair of adjacent via interconnects.

7. The substrate of claim 1, wherein the pair of adjacent via interconnects comprises:
a first via interconnect configured to provide a path for a first electrical current; and
a second via interconnect configured to provide a path for a second electrical current.

8. The substrate of claim 7,
wherein the first via interconnect is part of a first netlist circuit, and
wherein the second via interconnect is part of a second netlist circuit.

9. The substrate of claim 1, wherein the pair of adjacent via interconnects comprises:
a first via interconnect configured to provide a path for a first electrical signal; and
a second via interconnect configured to provide a path for ground.

10. The substrate of claim 1, wherein the pair of adjacent via interconnects comprises:
a first via interconnect configured to provide a path for a power; and
a second via interconnect configured to provide a path for ground.

11. The substrate of claim 1, wherein the pair of adjacent via interconnects comprises:
a first via interconnect; and a second via interconnect configured to provide a second electrical current, wherein the second electrical current is configured to induce a first electrical current through the first via interconnect.

12. The substrate of claim 1, wherein the substrate includes a coreless substrate or a cored substrate that includes a core layer.

13. A substrate comprising:
   at least one dielectric layer;
   a plurality of first interconnects located in the at least one dielectric layer;
   at least one photo-imageable dielectric layer coupled to the at least one dielectric layer; and
   a plurality of second interconnects located in the at least one photo-imageable dielectric layer, wherein the plurality of second interconnects comprises at least one via interconnect having a semi-circular planar shape.

14. The substrate of claim 13, wherein the plurality of second interconnects comprises:
   a first via interconnect having a first semi-circular planar shape; and
   a second via interconnect directly adjacent to the first via interconnect, wherein the second via interconnect has a second semi-circular planar shape.

15. The substrate of claim 14, wherein the first semi-circular planar shape is a mirror image of the second semi-circular planar shape.

16. The substrate of claim 13, wherein the plurality of second interconnects comprises at least one via interconnect having a trapezoid planar shape.

17. An apparatus comprising:
   an integrated device;
   a substrate coupled to the integrated device, the substrate comprising:
      at least one dielectric layer;
      a plurality of first interconnects located in the at least one dielectric layer;
      at least one photo-imageable dielectric layer coupled to the at least one dielectric layer; and
      a plurality of second interconnects located in the at least one photo-imageable dielectric layer, the plurality of second interconnects comprising at least one pair of adjacent via interconnects having a centroid to centroid distance that is less than a pitch between the pair of adjacent via interconnects.

18. The apparatus of claim 17, wherein a centroid of a via interconnect from the at least one pair of adjacent via interconnect is a position of a center of mass of the via interconnect.

19. The apparatus of claim 17, wherein a centroid of a via interconnect from the at least one pair of adjacent via interconnects is a point or line that represents a mean position of the via interconnect.

20. The apparatus of claim 17, wherein the pitch between the pair of adjacent via interconnects is a center to center distance between the pair of adjacent via interconnects.

21. The apparatus of claim 17, wherein the pair of adjacent via interconnects includes a via interconnect having a semi-circular planar shape and/or a trapezoid planar shape.

22. The apparatus of claim 17, wherein the apparatus includes a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and/or a device in an automotive vehicle.

23. A method for fabricating a substrate, comprising:
   forming at least one dielectric layer;
   forming a plurality of first interconnects in the at least one dielectric layer;
   forming at least one photo-imageable dielectric layer over the at least one dielectric layer; and
   forming a plurality of second interconnects in the at least one photo-imageable dielectric layer, wherein forming the plurality of second interconnects comprises forming at least one pair of adjacent interconnects having a centroid to centroid distance that is less than a pitch between the pair of adjacent interconnects.

24. The method of claim 23, wherein a centroid of an interconnect from the at least one pair of adjacent interconnects is a position of a center of mass of the interconnect.

25. The method of claim 23, wherein a centroid of an interconnect from the at least one pair of adjacent interconnects is a point or line that represents a mean position of the interconnect.

26. The method of claim 23, wherein the pitch between the pair of adjacent interconnects is a center to center distance between the pair of adjacent interconnects.

27. The method of claim 23, wherein forming the plurality of second interconnects comprises forming at least one via interconnect having a semi-circular planar shape and/or a trapezoid planar shape.

28. The method of claim 23, wherein forming the plurality of second interconnects comprises forming at least one via interconnect having a non-full circular planar shape and a non-rectangular planar shape.

29. The method of claim 23, wherein the pair of adjacent interconnects includes a pair of adjacent via interconnects and/or a pair of adjacent pad interconnects.

* * * * *